US010734398B2

(12) United States Patent
Huang et al.

(10) Patent No.: US 10,734,398 B2
(45) Date of Patent: Aug. 4, 2020

(54) FLASH MEMORY STRUCTURE WITH ENHANCED FLOATING GATE

(71) Applicant: Taiwan Semiconductor Manufacturing Co., Ltd., Hsin-Chu (TW)

(72) Inventors: Hung-Shu Huang, Taichung (TW); Ming Chyi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/245,394

(22) Filed: Jan. 11, 2019

(65) Prior Publication Data

US 2020/0075614 A1  Mar. 5, 2020

Related U.S. Application Data

(60) Provisional application No. 62/724,267, filed on Aug. 29, 2018.

(51) Int. Cl.
| | |
|---|---|
| *G11C 16/04* | (2006.01) |
| *H01L 27/11556* | (2017.01) |
| *H01L 29/423* | (2006.01) |
| *H01L 27/1158* | (2017.01) |
| *H01L 29/66* | (2006.01) |

(52) U.S. Cl.
CPC .... *H01L 27/11556* (2013.01); *G11C 16/0416* (2013.01); *H01L 27/1158* (2013.01); *H01L 29/42332* (2013.01); *H01L 29/42336* (2013.01); *H01L 29/66825* (2013.01)

(58) Field of Classification Search
CPC ............................. G11C 16/10; G11C 16/0483
USPC ......................................... 365/185.24, 185.26
See application file for complete search history.

(56) References Cited

U.S. PATENT DOCUMENTS

| | | | | |
|---|---|---|---|---|
| 5,386,132 | A * | 1/1995 | Wong | G11C 11/5621 |
| | | | | 257/316 |
| 6,724,036 | B1 * | 4/2004 | Hsieh | H01L 21/76224 |
| | | | | 257/314 |
| 6,930,348 | B2 * | 8/2005 | Wang | H01L 27/115 |
| | | | | 257/314 |
| 8,669,607 | B1 * | 3/2014 | Tsair | H01L 29/7881 |
| | | | | 257/316 |
| 9,548,312 | B1 * | 1/2017 | Beyer | H01L 27/11524 |
| 2002/0190307 | A1 * | 12/2002 | Tuan | H01L 27/115 |
| | | | | 257/315 |
| 2003/0227047 | A1 * | 12/2003 | Hsu | H01L 27/115 |
| | | | | 257/314 |
| 2004/0262668 | A1 * | 12/2004 | Wang | H01L 27/115 |
| | | | | 257/315 |

(Continued)

*Primary Examiner* — Michael T Tran
(74) *Attorney, Agent, or Firm* — Eschweiler & Potashnik, LLC

(57) ABSTRACT

In some embodiments, the present disclosure relates to a flash memory structure. The flash memory structure has a source region and a drain region disposed within a substrate. A select gate is disposed over the substrate between the source region and the drain region, and a floating gate is disposed over the substrate between the select gate and the source region. A control gate is disposed over the floating gate. The floating gate has sidewalls that define protrusions extending downward from a lower surface of the floating gate to define a recess within a bottom of the floating gate.

20 Claims, 14 Drawing Sheets

(56) References Cited

U.S. PATENT DOCUMENTS

| | | | |
|---|---|---|---|
| 2005/0026364 A1* | 2/2005 | Ding | H01L 27/105 438/257 |
| 2005/0087796 A1* | 4/2005 | Jung | H01L 27/115 257/315 |
| 2005/0199956 A1* | 9/2005 | Ding | H01L 27/115 257/365 |
| 2005/0202632 A1* | 9/2005 | Ding | H01L 27/11519 438/257 |
| 2005/0250335 A1* | 11/2005 | Huang | H01L 27/115 438/700 |
| 2006/0071265 A1* | 4/2006 | Koh | G11C 16/0433 257/315 |
| 2007/0004134 A1* | 1/2007 | Vora | H01L 27/105 438/257 |
| 2007/0023815 A1* | 2/2007 | Oh | H01L 27/115 257/314 |
| 2008/0067572 A1* | 3/2008 | Mokhlesi | H01L 27/115 257/315 |
| 2008/0093653 A1* | 4/2008 | Park | H01L 27/115 257/316 |
| 2008/0153226 A1* | 6/2008 | Mokhlesi | H01L 27/115 438/259 |
| 2009/0098721 A1* | 4/2009 | Liu | H01L 27/11521 438/593 |
| 2011/0309426 A1* | 12/2011 | Purayath | H01L 21/764 257/316 |
| 2012/0261736 A1* | 10/2012 | Hsu | H01L 29/40114 257/315 |
| 2013/0307051 A1* | 11/2013 | Chen | H01L 29/66825 257/321 |
| 2014/0346583 A1* | 11/2014 | Purayath | H01L 27/11541 257/316 |
| 2014/0353737 A1* | 12/2014 | Iwamoto | H01L 29/66825 257/315 |
| 2015/0063025 A1* | 3/2015 | Takekida | G11C 16/0433 365/185.05 |
| 2015/0145019 A1* | 5/2015 | Park | H01L 27/11521 257/316 |
| 2015/0333173 A1* | 11/2015 | Wu | H01L 29/42324 257/320 |
| 2016/0013195 A1* | 1/2016 | Tsao | H01L 29/42328 257/316 |
| 2016/0064394 A1* | 3/2016 | Chu | H01L 29/7883 257/321 |
| 2016/0365456 A1* | 12/2016 | Liu | H01L 29/7883 |
| 2016/0379987 A1* | 12/2016 | Liu | H01L 27/11524 257/316 |
| 2017/0301683 A1* | 10/2017 | Chen | H01L 27/11546 |

* cited by examiner

FLASH MEMORY STRUCTURE WITH ENHANCED FLOATING GATE

REFERENCE TO RELATED APPLICATION

This application claims priority to U.S. Provisional Application No. 62/724,267, filed on Aug. 29, 2018, the contents of which are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Flash memory is a type of non-volatile memory that can be electrically erased and reprogrammed. It is used in a wide variety of electronic devices and equipment (e.g., consumer electronics, automotive, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
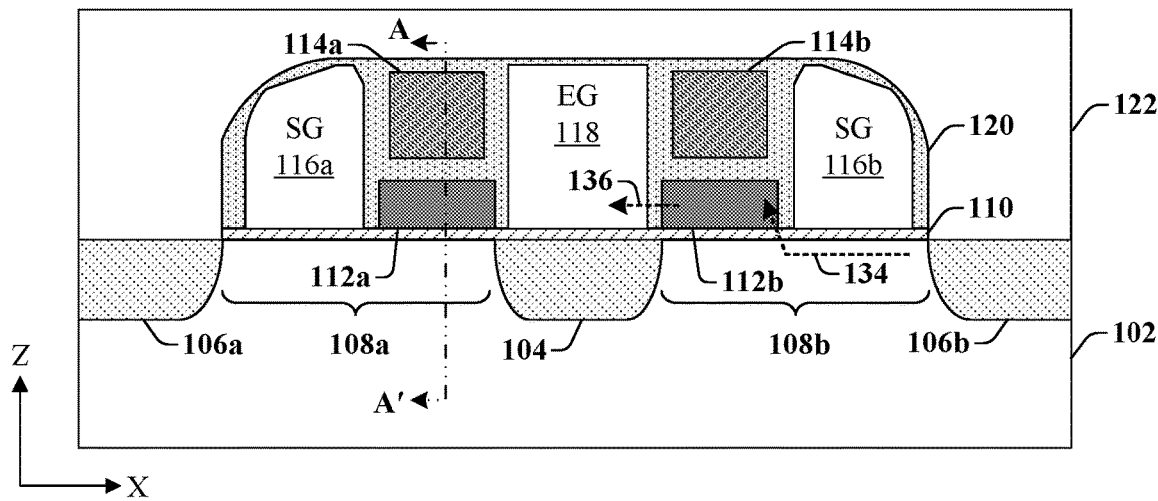
FIGS. 1A-1B illustrate cross-sectional views of some embodiments of a flash memory structure with an enhanced floating gate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded memory has become common in modern day integrated chips. Embedded memory is electronic memory that is located on a same integrated chip die as logic functions (e.g., a processor or ASIC). By embedding memory devices and logic devices on a same integrated chip die, the conductive interconnects between the memory devices and the logic devices can be shortened, thereby reducing power and increasing performance of the integrated chip. Flash memory is often used in many embedded memory systems due to its non-volatile nature (i.e., its ability to retain a stored data state without power), its high density, its fast write speeds, and its compatibility with modern CMOS fabrication processes.

Embedded flash memory structures often comprise a floating gate arranged between a control gate and a substrate. The floating gate has a flat lower surface that is separated from the substrate by a dielectric layer. During operation, a channel region is formed within the substrate below the floating gate. Applying a bias to the control gate causes charge carriers from the channel region to tunnel through the dielectric layer to within the floating gate. Charges trapped within the floating gate are indicative of a stored data state (e.g., a logic "0" or "1").

However, as the size of flash memory cells scales, a length of the control gate also decreases and the control gate may begin to experience short channel effects (e.g., drain induced barrier lowering, velocity saturation, etc.), which can degrade performance of the flash memory cells. For example, short channel effects can make it more difficult for charge carriers to be driven into the floating gate (i.e., give the floating gate a low coupling ratio), leading to data programming inefficiency (e.g., difficulty driving charges into the floating gate) and/or a smaller read window (i.e., a smaller difference in current output between a stored '0' and a stored '1').

The present disclosure, in some embodiments, relates to a flash memory structure having an enhanced floating gate that is configured to improve device performance. The flash memory structure comprises a source region and a drain region disposed within a substrate. A select gate and a floating gate are disposed over the substrate between the source region and the drain region. A control gate is disposed over the floating gate. The floating gate has sidewalls that define protrusions extending vertically outward from a lower surface of the floating gate. The protrusions cause the floating gate to wrap around a part of the substrate where a channel region forms, thereby increasing a size of an interfacing area between the channel region and the floating gate (e.g., relative floating gates having flat lower surfaces). Increasing a size of the interfacing area makes it easier for charge carriers to be driven into the floating gate, thereby improving data programming efficiency and a read window of the disclosed flash memory structure.

Figure 1B:
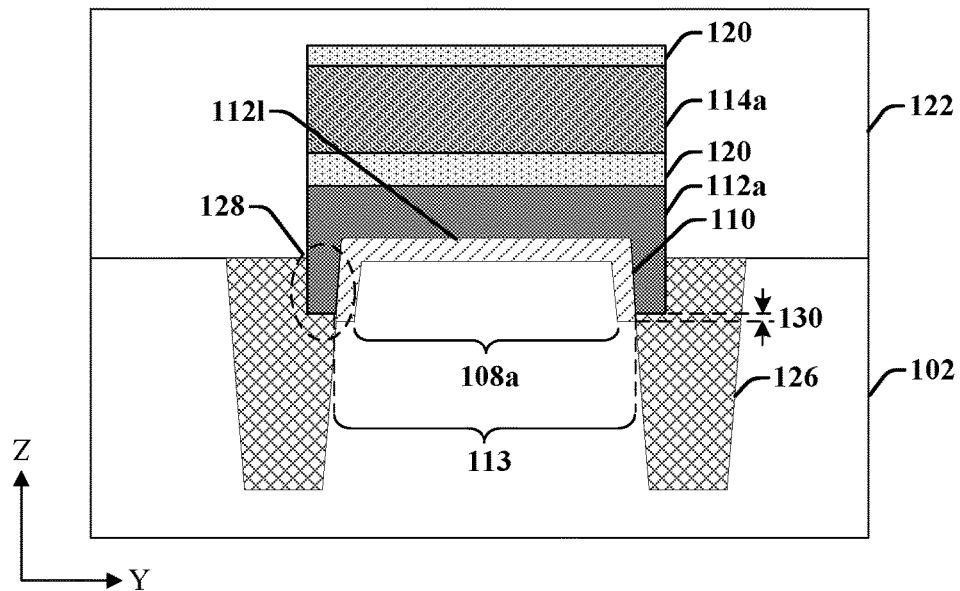

FIGS. 1A-1B illustrate cross-sectional views, 100 and 124, of some embodiments of a flash memory structure with an enhanced floating gate.

FIG. 1A illustrates a cross-sectional view 100 of the flash memory structure along a first direction (X-direction) and a second direction (Z-direction). As shown in cross-sectional view 100, the flash memory structure comprises a common source region 104 disposed within a substrate 102 between a first drain region 106a and a second drain region 106b. A first channel region 108a extends between the common source region 104 and the first drain region 106a. A second channel region 108b extends between the common source region 104 and the second drain region 106b.

The flash memory structure further comprises a first floating gate 112a disposed over the first channel region 108a and configured to store charges associated with a first data state (e.g., a '1' or a '0'). The first floating gate 112a is separated from the substrate 102 by a dielectric layer 110 and from an overlying first control gate 114a by one or more additional dielectric materials 120. A first select gate 116a is disposed on a first side of the first floating gate 112a. A common erase gate 118 is disposed on a second side of the first floating gate 112a opposing the first side. The one or more additional dielectric materials 120 laterally separate the first floating gate 112a from both the first select gate 116a and the common erase gate 118.

A second floating gate 112b is disposed over the second channel region 108b and is configured to store charges associated with a second data state. The second floating gate 112b is separated from the underlying substrate 102 by the dielectric layer 110 and from an overlying second control gate 114b by the one or more additional dielectric materials 120. A second select gate 116b is disposed on a first side of the second floating gate 112b. The common erase gate 118 is disposed on a second side of the second floating gate 112b opposing the first side. The one or more additional dielectric materials 120 laterally separate the second floating gate 112b from both the second select gate 116b and the common erase gate 118. An inter-level dielectric (ILD) structure may be arranged over the one or more additional dielectric materials 120.

FIG. 1B illustrates a cross-sectional view 124 of the flash memory structure along cross-section A-A' of FIG. 1A. The cross-sectional view 124 extends along a third direction (Y-direction) and the second direction (Z-direction).

As shown in cross-sectional view 124, a plurality of isolation structures 126 are arranged in trenches within the substrate 102. The plurality of isolation structures 126 are arranged on opposing sides of the first floating gate 112a. The first floating gate 112a extends from between the plurality of isolation structures 126 to directly over the plurality of isolation structures 126. The first floating gate 112a comprises protrusions 128 extending outward (e.g., downward) from a lower surface 112l of the first floating gate 112a to define a recess 113 within a bottom of the floating gate 112a. The protrusions 128 cause the first floating gate 112a to wrap around multiple surfaces of a part of the substrate 102 comprising the first channel region 108a. The dielectric layer 110 lines interior surfaces of the substrate 102 along an interfacing area between the substrate 102 and the first floating gate 112a. In some embodiments, the dielectric layer 110 may extend vertically past a bottom of the first floating gate 112a by a first non-zero distance 130. The second floating gate (112b of FIG. 1A) also has protrusions extending outward (e.g., downward) from a lower surface of the second floating gate to wrap around multiple surfaces of a part of the substrate comprising the second channel region.

Referring again to FIG. 1A, to write data to the first floating gate 112a, voltages can be applied to the first control gate 114a and the first select gate 116a. The voltages cause the first select gate 116a to generate a first electric field that drives charge carriers (along line 134) into the first channel region 108a. The voltages further cause the first control gate 114a to generate a second electric field that injects the charge carriers within the first channel region 108a across the dielectric layer 110 into the first floating gate 112a. The injected charge carriers alter the floating gate threshold voltage to represent a logic '0' state (while an uncharged floating gate represents a '1' state). Erasing data from the first floating gate 112a may be accomplished by applying a negative voltage to the common erase gate 118. The negative voltage drives stored charges from the first floating gate 112a to the common erase gate 118 by the process of Fowler-Nordheim tunneling (along line 136).

Once programmed, data may be read from the first floating gate 112a by applying reference voltages to the first select gate 116a and to the first drain region 106a while the common source region 104 is grounded. The embedded flash memory cell conducts current if the first floating gate 112a is erased (low threshold state) and the embedded flash memory cell outputs a logical '1'. However, if the first floating gate 112a is programmed (a high threshold state), the embedded flash memory cell is non-conductive and the embedded flash memory cell outputs a logical "0".

By wrapping the first floating gate 112a around the substrate 102 an interfacing area between the first floating gate 112a and the substrate 102 is increased over floating gates having a flat lower surface. By increasing the interfacing area between the first floating gate 112a and the substrate 102, charge carriers within the first channel region 108a can more easily enter into the first floating gate 112a, thereby increasing an amount of charge on the first floating gate 112a and improving a write efficiency. The increased amount of charge on the first floating gate 112a also increases a difference in channel conductivity between different data states and therefore increases a read window of the first floating gate 112a.

Figure 2A:
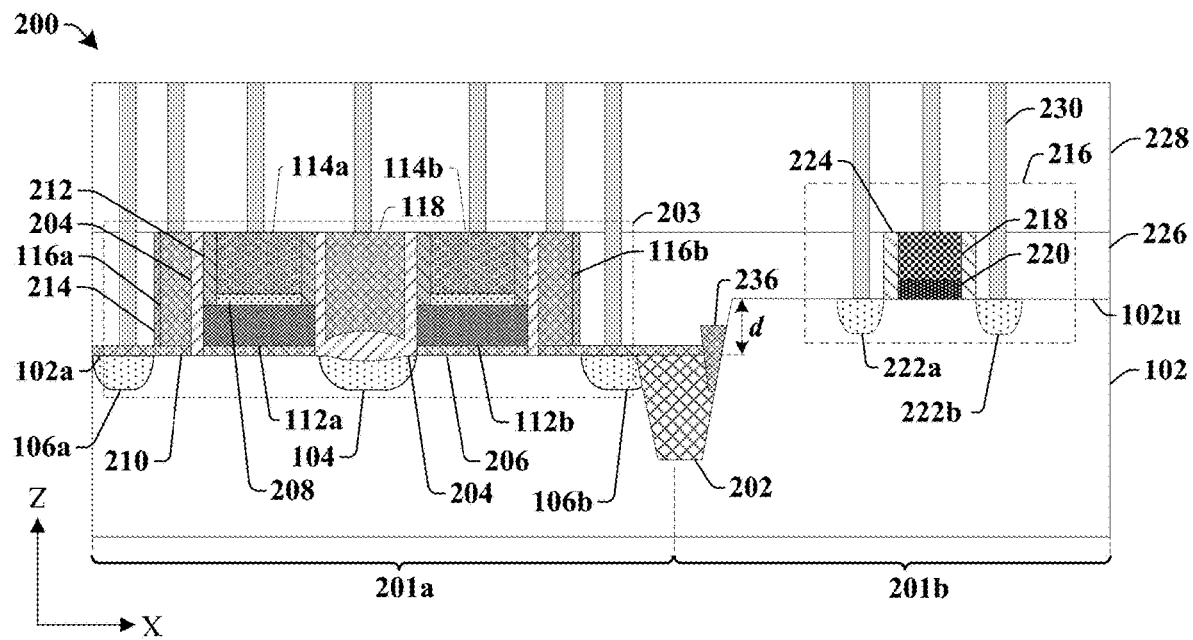
FIGS. 2A-2C illustrate some additional embodiments of an integrated chip having an embedded flash memory structure with an enhanced floating gate.
Figure 2B:
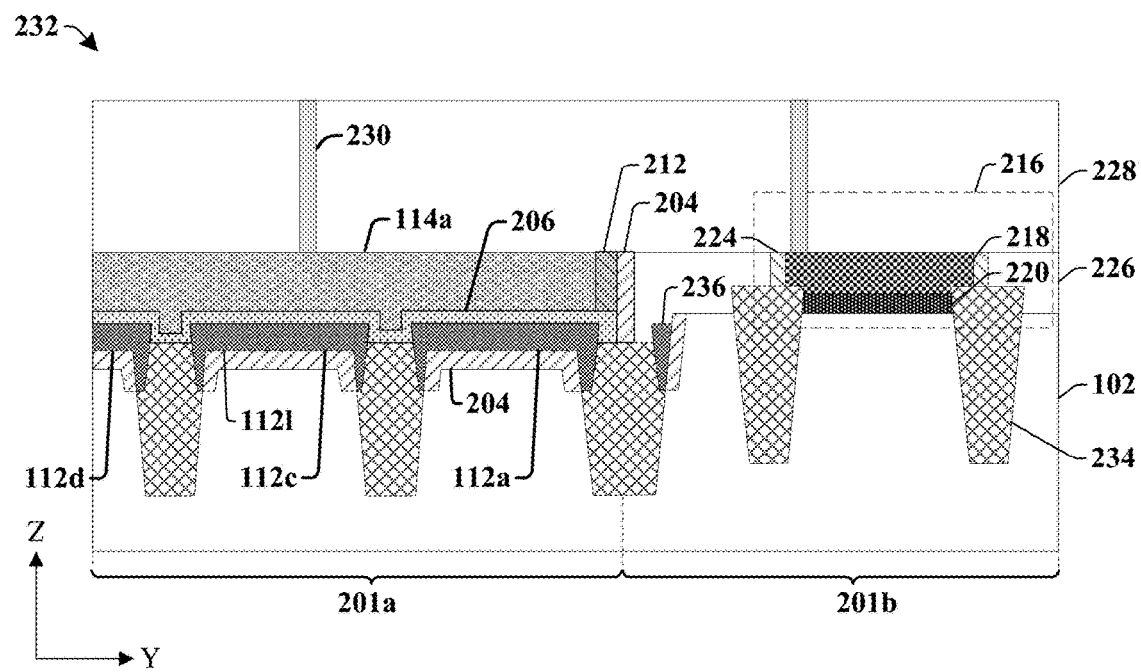
Figure 2C:
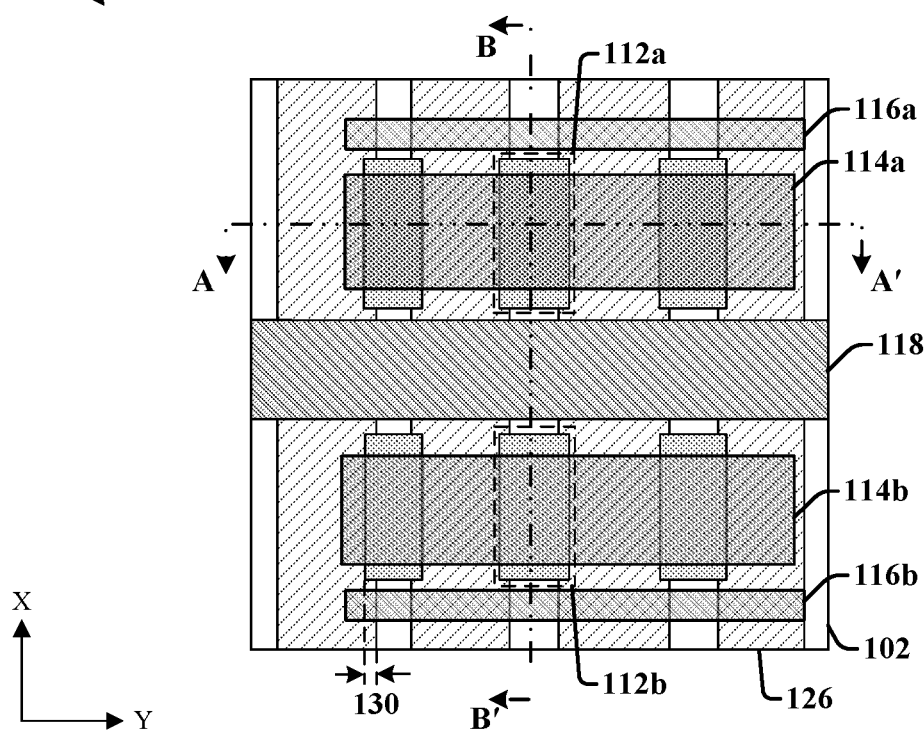

FIGS. 2A-2C illustrate some additional embodiments of an integrated chip having an embedded flash memory structure with an enhanced floating gate.

FIG. 2A illustrates a cross-sectional view 200 of the integrated chip along a first direction (X-direction) and a second direction (Z-direction). As shown in cross-sectional view 200, the integrated chip comprises a substrate 102 having an embedded memory region 201a and a logic region 201b. In some embodiments, the substrate 102 may have a recessed surface 102a within the embedded memory region 201a. The recessed surface 102a is recessed below an upper surface 102u of the substrate 102 by a non-zero distance d. In some embodiments, the recessed surface 102a is coupled to the upper surface by an angled sidewall. In some embodiments, an isolation structure 202 may be arranged along edges of the recessed surface 102a of the substrate 102.

The embedded memory region 201a comprises an embedded flash memory structure 203 having a common source region 104 that is separated from an overlying common erase gate 118 by a first dielectric layer 204. In some embodiments, the first dielectric layer 204 also extends along sidewalls of the common erase gate 118. A first floating gate 112a and a second floating gate 112b are arranged on opposing sides of the common erase gate 118.

The first floating gate 112a is separated from the underlying substrate 102 by a second dielectric layer 206 and from an overlying first control gate 114a by a third dielectric layer 208. The second floating gate 112b is separated from the underlying substrate 102 by the second dielectric layer 206 and from an overlying second control gate 114b by the third dielectric layer 208. A first select gate 116a is disposed on a first side of the first floating gate 112a opposing the common erase gate 118 and a second select gate 116b is disposed on a second side of the second floating gate 112b opposing the common erase gate 118. The first select gate 116a is laterally separated from the first floating gate 112a and the first control gate 114a by the first dielectric layer 204. The second select gate 116b is laterally separated from the second floating gate 112b and the second control gate 114b by the first dielectric layer 204. The first select gate 116a and the second select gate 116b are vertically separated from the substrate 102 by a fourth dielectric layer 210.

A first sidewall spacer 212 is arranged along opposing sides of the first control gate 114a and the second control gate 114b. The first sidewall spacer 212 laterally separates the first control gate 114a and the second control gate 114b from the common erase gate 118 and from the first select gate 116a and the second select gate 116b. A second sidewall spacer 214 is arranged along sidewalls of the first select gate 116a and the second select gate 116b that face away from the common erase gate 118.

The logic region 201b comprises a transistor device 216 arranged within the substrate 102. The transistor device 216 comprises a gate electrode 218 disposed over the substrate 102 between a source region 222a and a drain region 222b. The gate electrode 218 is separated from the substrate 102 by a gate dielectric layer 220 comprising one or more dielectric materials. In some embodiments, the gate electrode 218 may comprise a metal such aluminum, ruthenium, palladium, hafnium, zirconium, titanium, or the like. In some embodiments, the gate dielectric layer 220 may comprise a high-k dielectric material, such as hafnium oxide ($HfO_2$), $TiO_2$, HfZrO, $Ta_2O_3$, $HfSiO_4$, $ZrO_2$, $ZrSiO_2$, or the like. Sidewall spacers 224 are arranged on opposing sides of the gate electrode 218 and the gate dielectric layer 220.

A first inter-level dielectric (ILD) layer 226 is arranged over the substrate 102 and laterally surrounds the embedded flash memory structure 203 and the transistor device 216. A second ILD layer 228 is arranged over the first ILD layer 226. Conductive contacts 230 extend through the first ILD layer 226 and the second ILD layer 228 to contact the embedded flash memory structure 203 and the transistor device 216. In some embodiments, the first ILD layer 226 may comprise one or more of low-pressure tetraethyl orthosilicate (TEOS), silicon rich oxide (SRO), plasma-enhanced (PE) oxynitride, PE nitride, and PE-TEOS. In some embodiments, the second ILD layer 228 may comprise one or more of silicon dioxide, SiCOH, a fluorosilicate glass, a phosphate glass (e.g., borophosphate silicate glass), or the like. In some embodiments, the conductive contacts 230 may comprise a metal (e.g., tungsten, aluminum, etc.) such as tungsten, copper, or the like.

FIG. 2B illustrates a cross-sectional view 232 extending along the second direction (Z-direction) and along a third direction (Y-direction).

As shown in cross-sectional view 232, a first plurality of isolation structures 126 are disposed within trenches in the substrate 102 in the embedded memory region 201a. A second plurality of isolation structures 234 are disposed within trenches in the substrate 102 in the logic region 201b. In some embodiments, the first plurality of isolation structures 126 and the second plurality of isolation structures 234 may respectively comprise shallow trench isolation structures having one or more dielectric materials disposed within the trenches in the substrate 102.

The first control gate 114a continuously extends over a plurality of floating gates 112a, 112c, and 112d. The plurality of floating gates 112a, 112c, and 112d respectively comprise protrusions 128 extending outward (e.g., downward) from lower surfaces 112l of the plurality of floating gates 112a, 112c, and 112d. The protrusions 128 are respectively arranged along outermost sidewalls of the plurality of floating gates 112a, 112c, and 112d. The outermost sidewalls of the plurality of floating gates 112a, 112c, and 112d are separated by the first plurality of isolation structures 126 and by the second dielectric layer 206. The second dielectric layer 206 further separates the plurality of floating gates 112a, 112c, and 112d from the first control gate 114a. In some embodiments, a remnant of floating gate material 236 may be arranged along a sidewall of the substrate 102 between the embedded memory region 201a and the logic region 201b.

FIG. 2C illustrates a top-view 238 of the integrated chip showing cross-section A-A' of FIG. 2A and cross-section B-B' of FIG. 2B. The top-view 238 extends along the first direction (X-direction) and the third direction (Y-direction).

Figure 3:
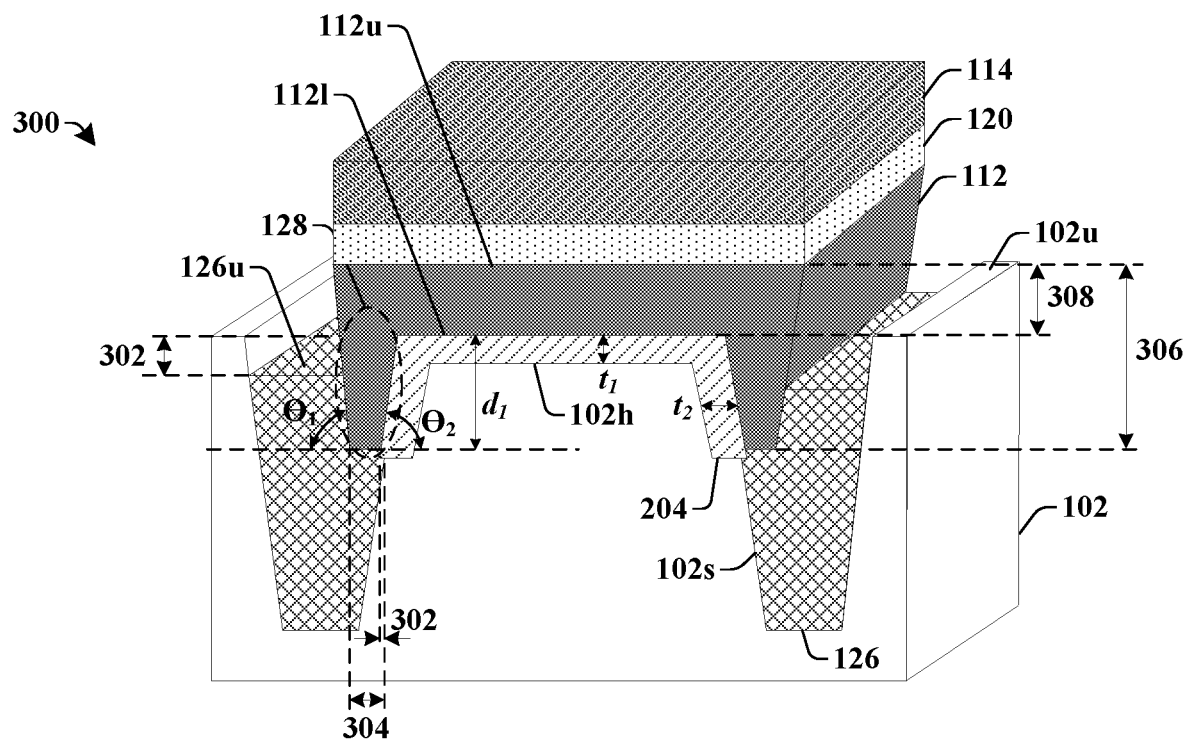
FIG. 3 illustrates a three-dimensional view of some embodiments of an integrated chip having a flash memory structure comprising an enhanced floating gate.

FIG. 3 illustrates a three-dimensional view of some embodiments of an integrated chip 300 having a flash memory structure comprising an enhanced floating gate.

The integrated chip 300 comprises a plurality of isolation structures 126 disposed within trenches in an upper surface 102u of a substrate 102. The trenches are defined by angled sidewalls 102s of the substrate 102, which cause a width of the trenches to decrease as a distance from the upper surface 102u of the substrate 102 increases.

A first dielectric layer 204 extends along the sidewalls 102s and a horizontally extending surface 102h of the substrate 102. The first dielectric layer 204 may comprise an oxide (e.g., silicon oxide), a nitride (e.g., silicon oxynitride), or the like. In some embodiments, the first dielectric layer 204 may protrude outward past the sidewalls 102s of the substrate 102 defining the trenches by a first non-zero distance 302. In some embodiments, a horizontally extending segment of the first dielectric layer 204 disposed along the horizontally extending surface 102h of the substrate 102 may have a first thickness $t_1$ that is different than a second thickness $t_2$ of vertically extending segments disposed along sidewalls 102s of the substrate 102.

A floating gate 112 is arranged over the first dielectric layer 204 and between the plurality of isolation structures 126. The floating gate 112 laterally extends from directly over the horizontally extending surface 102h of the substrate 102 to directly over the plurality of isolation structures 126. In some embodiments, the floating gate 112 may laterally extend over one of the plurality of isolation structures 126 by a second non-zero distance 304. In some embodiments, the second non-zero distance 304 may be in a range of between approximately 30 angstroms and approximately 100 angstroms. In some embodiments, the plurality of isolation structures 126 have uppermost surfaces 126u that are recessed below an upper surface 112u of the floating gate 112.

The floating gate 112 comprises protrusions 128 that protrude outward (e.g., downward) from a lower surface 112l of the floating gate 112 to within the trenches. The protrusions 128 cause the floating gate 112 to have a first height 306 along outer sidewalls of the floating gate 112 and a second height 308 between the protrusions 128. The first height 306 is greater than the second height 308. In some embodiments, a difference between the first height 306 and the second height 308 may be in a range of between approximately 50 angstroms and approximately 150 angstroms. In some embodiments, the protrusions 128 are defined by angled sidewalls that reduce a width of the protrusions 128 as a distance from the lower surface 112l of the floating gate 112 increases. In some embodiments, opposing sidewalls of the protrusions 128 may have different sidewall angles. For example, in some embodiments, the protrusions 128 are defined by a first sidewall that is oriented at a first acute angle $\theta_1$ with respect to a horizontal plane extending along a bottommost surface of the floating gate 112 and an opposing second sidewall that is oriented at a second acute angle $\theta 2$ with respect to the horizontal plane, which is different than the first acute angle $\theta_1$.

FIGS. 4-22 illustrate cross-sectional views 400-2200 of some embodiments of a method of forming an integrated chip having an embedded flash memory structure with an enhanced floating gate. Although FIGS. 4-22 are described in relation to a method, it will be appreciated that the structures disclosed in FIGS. 4-22 are not limited to such a method, but instead may stand alone as structures independent of the method.

Figure 4:
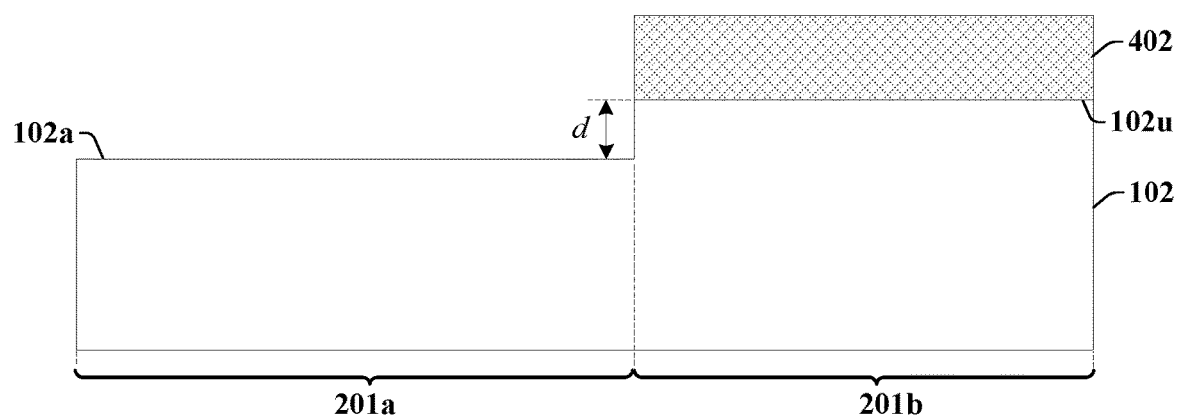
FIGS. 4-22 illustrate cross-sectional views of some embodiments of a method of forming an integrated chip having an embedded flash memory structure with an enhanced floating gate.

As shown in cross-sectional view 400 of FIG. 4, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 has an embedded memory region 201a and a logic region 201b. In some embodiments, the embedded memory region 201a of the substrate 102 may have a recessed surface 102a that is recessed to a distance d below an upper surface 102u of the substrate 102. The distance d may be, for example, about 10-1000 angstroms, about 10-500 angstroms, about 500-1000 angstroms, about 250-350 angstroms, or some other suitable recessing range(s).

In some embodiments, the substrate 102 may be recessed by forming a first masking layer 402 over the logic region 201b and subjecting the embedded memory region 201a to a thermal oxidation process that forms an oxide within the embedded memory region 201a. The thermal oxidation process will consume a part of the substrate 102 within the embedded memory region 201a, thereby recessing a surface of the substrate 102 within the embedded memory region 201a. The oxide within the embedded memory region 201a is subsequently removed, resulting in the recessed surface 102a in the substrate 102. In alternative embodiments, the substrate 102 may be recessed within the embedded memory region 201a by forming a first masking layer 402 over the logic region 201b and subsequently etching the substrate 102 in regions not covered by the first masking layer.

Figure 5:
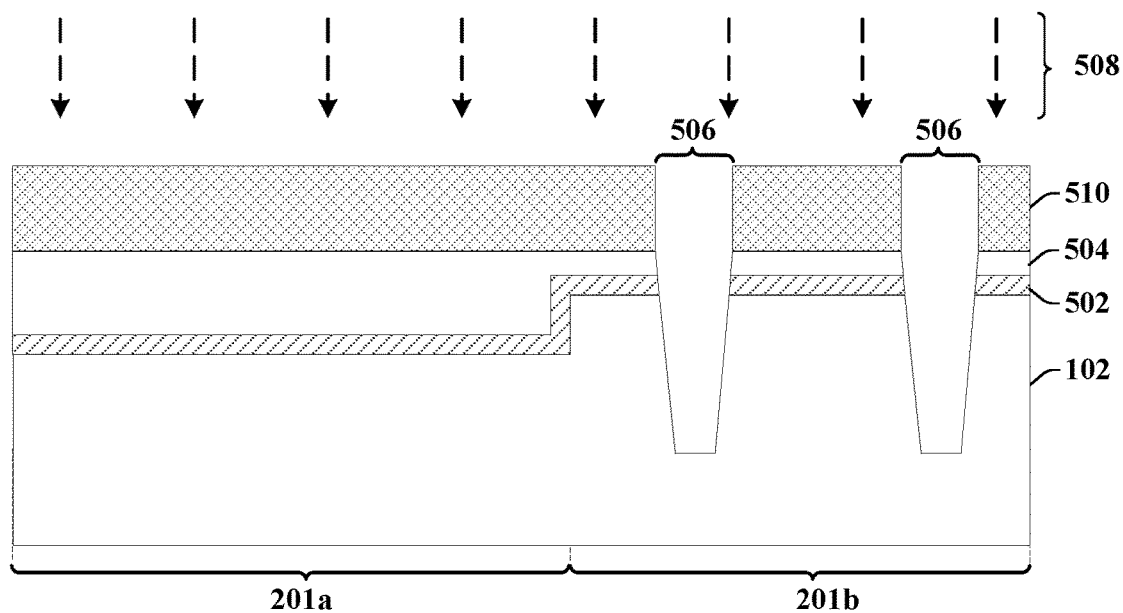

As shown in cross-sectional view 500 of FIG. 5, a pad dielectric layer 502 is formed over the substrate 102 and a first protective layer 504 is formed over the pad dielectric layer 502. A first plurality of trenches 506 are formed, and extend through the first protective layer 504 and the pad dielectric layer 502 to within the substrate 102. In some embodiments, the first plurality of trenches 506 may be formed by selectively exposing the first protective layer 504, the pad dielectric layer 502, and the substrate 102 to a first etchant 508 according to a second masking layer 510.

Figure 6:
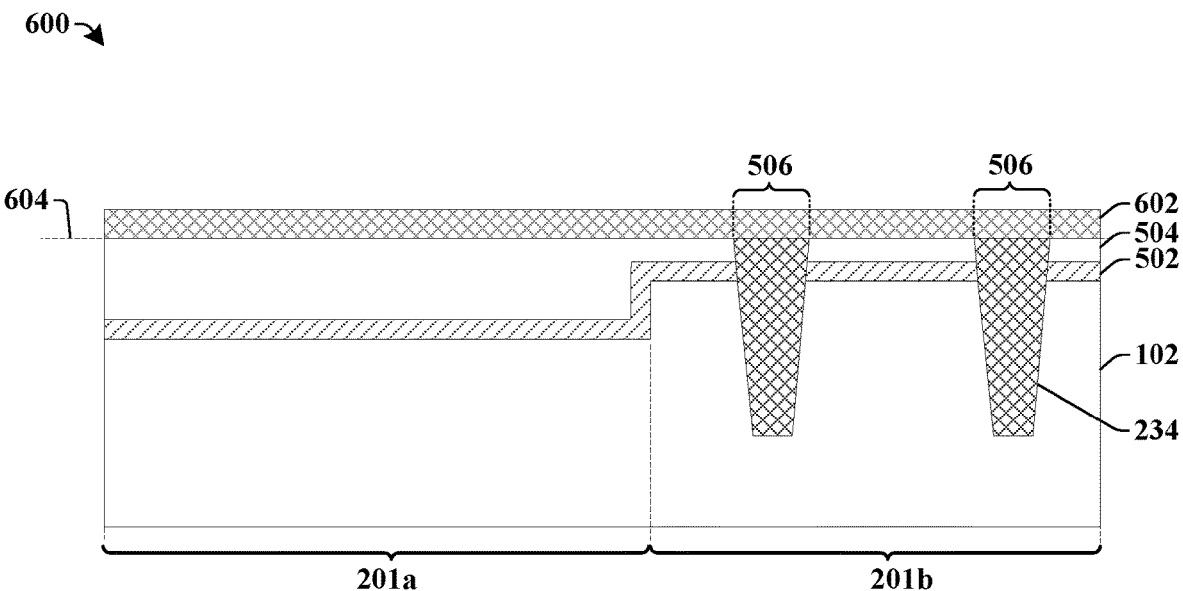

As shown in cross-sectional view 600 of FIG. 6, the first plurality of trenches 506 are filled with a first isolation layer 602 comprising one or more dielectric materials. In some embodiments, the first isolation layer 602 may be formed by way of a deposition process to fill the first plurality of trenches 506 and to extend over an uppermost surface of the first protective layer 504. A first planarization process (e.g., a chemical mechanical planarization process) may subsequently be performed (along line 604) to remove the first isolation layer 602 from over the uppermost surface of the first protective layer 504 and to define a plurality of isolation structures 234. In some embodiments, the first isolation layer 602 may comprise an oxide (e.g., silicon oxide), a nitride, or the like. In some embodiments, the first protective layer 504 may be removed after the first planarization process is completed.

Figure 7:
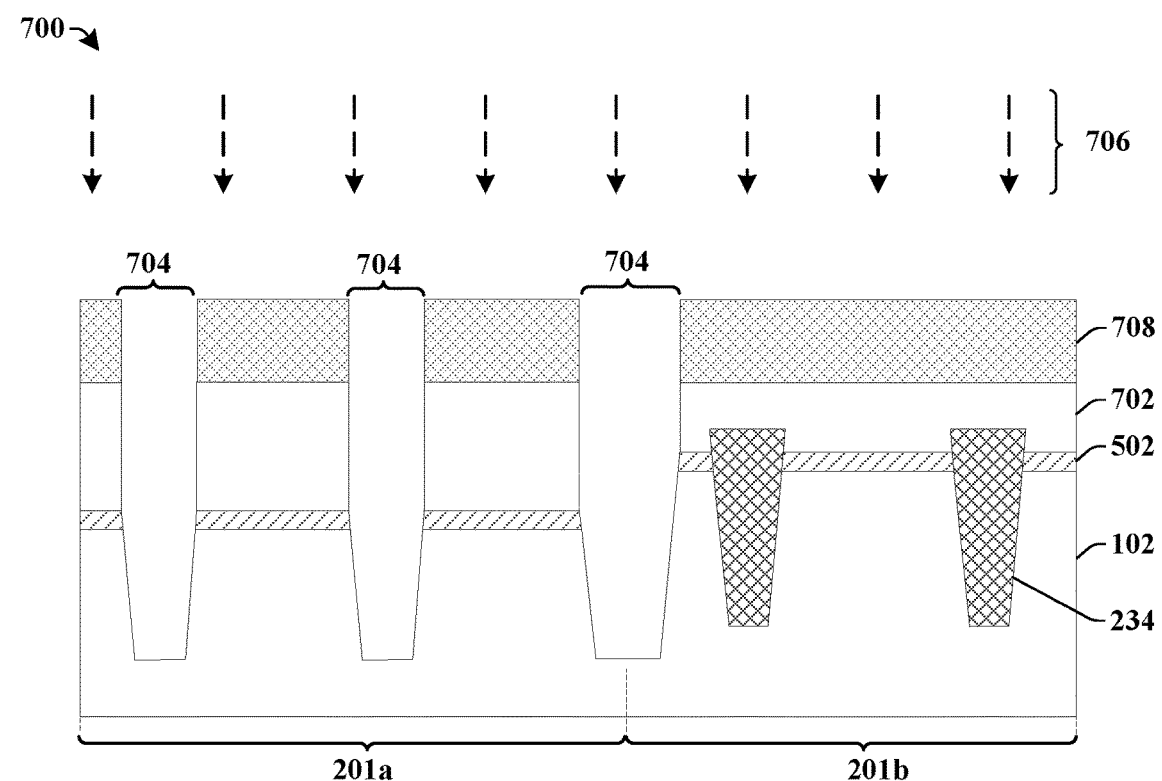

As shown in cross-sectional view 700 of FIG. 7, a second protective layer 702 is formed over the substrate 102. The second protective layer 702 is arranged over the pad dielectric layer 502 and the plurality of isolation structures 234. A second plurality of trenches 704 are formed, and extend through the second protective layer 702 and the pad dielectric layer 502 to within the substrate 102. In some embodiments, the second plurality of trenches 704 may be formed by selectively exposing the second protective layer 702, the pad dielectric layer 502, and the substrate 102 to a second etchant 706 according to a third masking layer 708.

Figure 8:
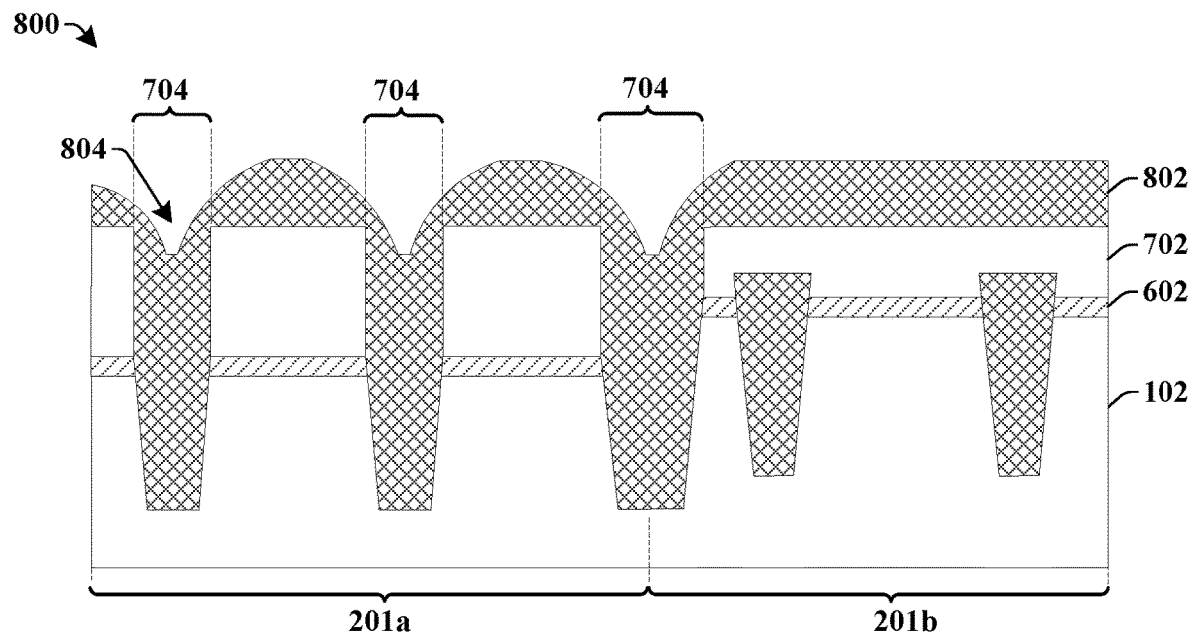

As shown in cross-sectional view 800 of FIG. 8, a second isolation layer 802 is formed to line the second plurality of trenches 704 and an uppermost surface of the second protective layer 702. The second isolation layer 802 defines divots 804 arranged within an upper surface of the second isolation layer 802. The divots 804 are directly over the second plurality of trenches 704. In some embodiments, the divots 804 may extend to positions that are vertically below the uppermost surface of the second protective layer 702 (i.e., so that a horizontal line extending along bottoms of the divots 804 intersects sidewalls of the second protective layer 702). In some embodiments, the second isolation layer 802 may comprise an oxide or a nitride. For example, the second isolation layer 802 may comprise silicon dioxide, silicon nitride, or the like. In various embodiments, the second isolation layer 802 may be formed by way of a deposition process (e.g., PVD, CVD, PE-CVD, ALD, or the like).

Figure 9:
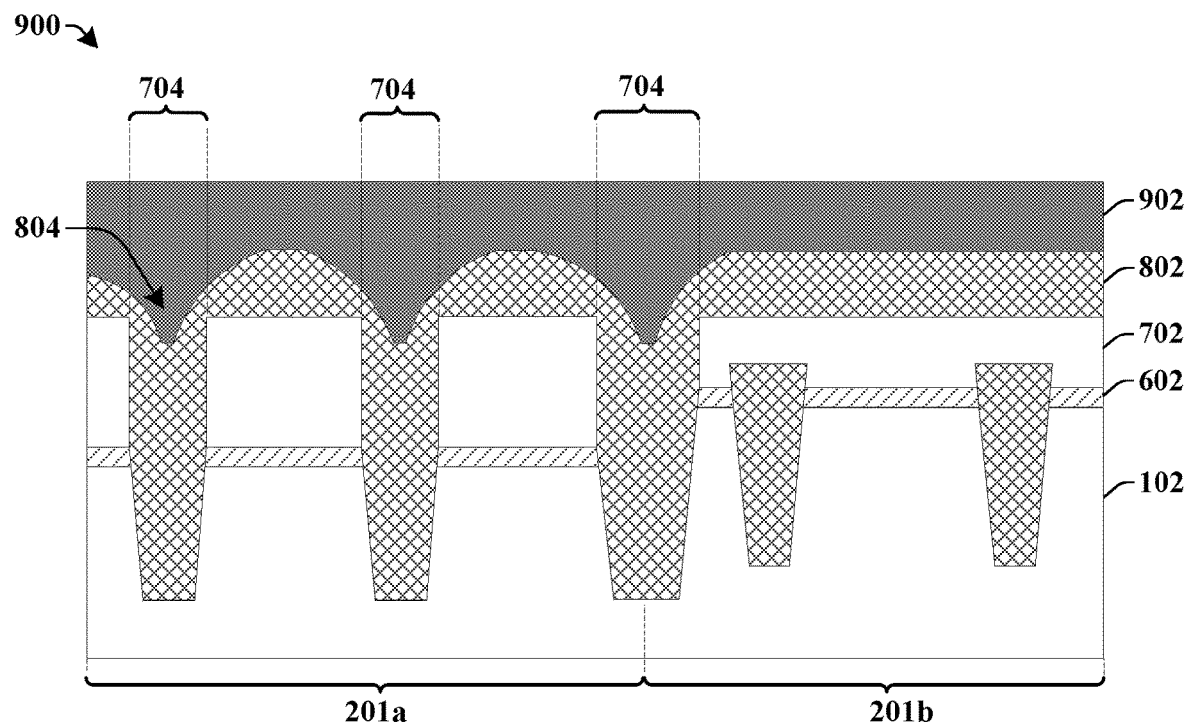

As shown in cross-sectional view 900 of FIG. 9, a sacrificial masking layer 902 is formed over the second isolation layer 802. The sacrificial masking layer 902 is arranged over the second isolation layer 802 and within the divots 804. In some embodiments, the sacrificial masking layer 902 may comprise polysilicon. In other embodiments, the sacrificial masking layer 902 may comprise a different material (e.g., titanium, tantalum, or the like) having a high etching selectivity with respect to the second isolation layer 802. In some embodiments, the sacrificial masking layer 902 may be formed by way of a deposition process (e.g., PVD, CVD, PE-CVD, ALD, or the like).

Figure 10:
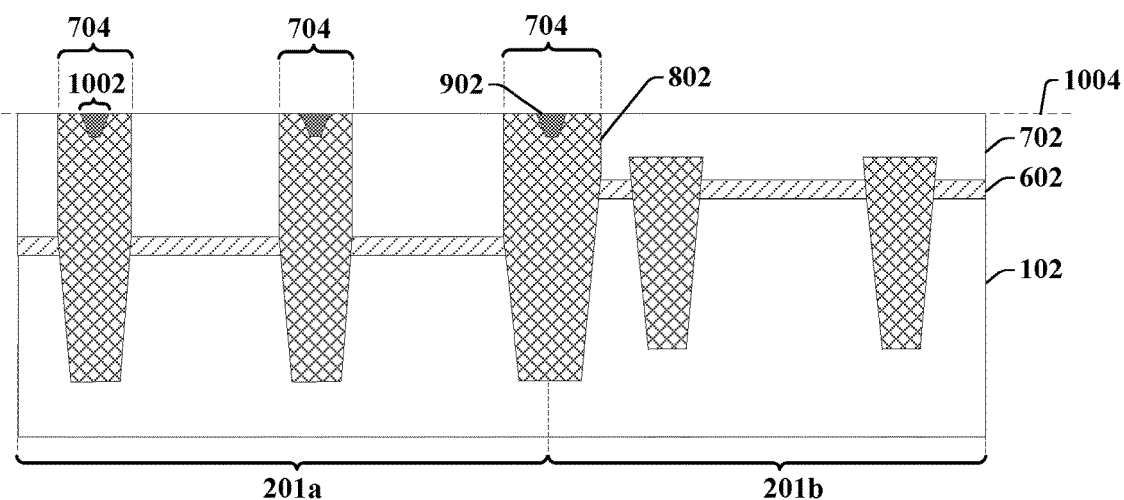

As shown in cross-sectional view 1000 of FIG. 10, parts of the sacrificial masking layer 902 and the second isolation layer 802 are removed. Removing parts of the sacrificial masking layer 902 and the second isolation layer 802 results in a remainder of the sacrificial masking layer 1002, which has outermost sidewalls that are separated by the second isolation layer 802 from sidewalls of the second protective layer 702 that define the second plurality of trenches 704. In some embodiments, the parts of the sacrificial masking layer 902 and the second isolation layer 802 may be removed by exposing the sacrificial masking layer 902 and the second isolation layer 802 to a third etchant. The third etchant reduces a thickness of the sacrificial masking layer 902 and the second isolation layer 802. In other embodiments, the parts of the sacrificial masking layer 902 and the second isolation layer 802 may be removed by a second planarization process (e.g., a chemical mechanical planarization (CMP) process) performed along line 1004.

Figure 11:
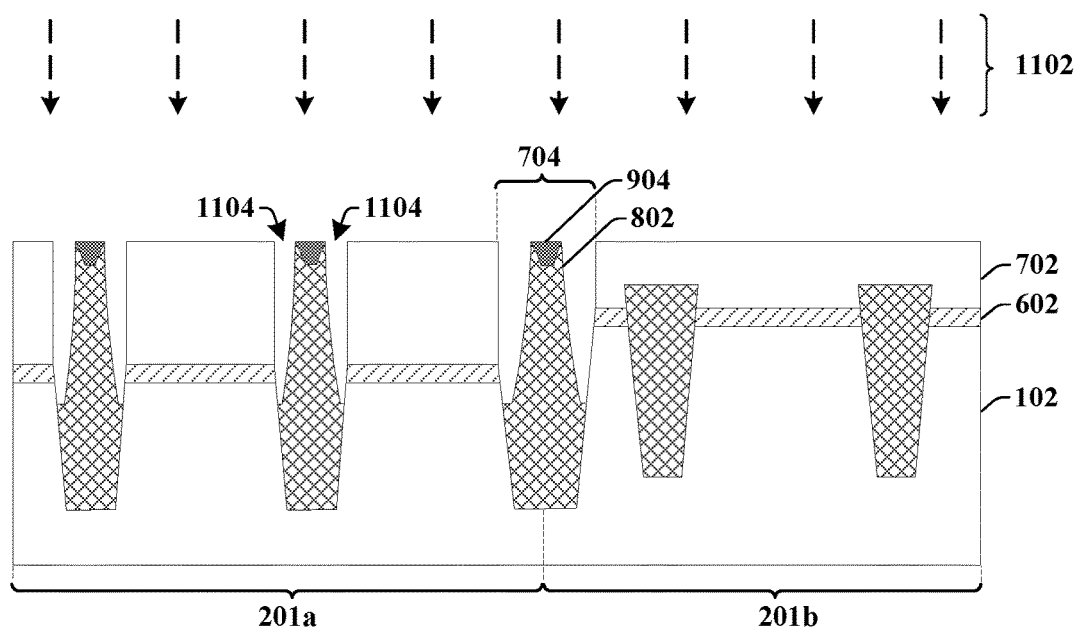

As shown in cross-sectional view 1100 of FIG. 11, the second isolation layer 802 is selectively removed between the remainder of the sacrificial masking layer 904 and the sidewalls of the second protective layer 702 defining the second plurality of trenches 704. The selective removal of the second isolation layer 802 forms depressions 1104 along edges of the second plurality of trenches 704. The depressions 1104 extend along edges of the second plurality of trenches 704, through the second protective layer 702 and the pad dielectric layer 502, to positions that are between sidewalls of the substrate 102 and the second isolation layer 802. In some embodiments, the second isolation layer 802 is selectively removed by exposing the second isolation layer 802 to a fourth etchant 1102 while using the sacrificial masking layer 904 as a mask. The sacrificial masking layer 904 will block the fourth etchant 1102 from etching the isolation layer 802 below the sacrificial masking layer 904, while allowing removal of the second isolation layer 802 along edges of the second plurality of trenches 704.

Figure 12:
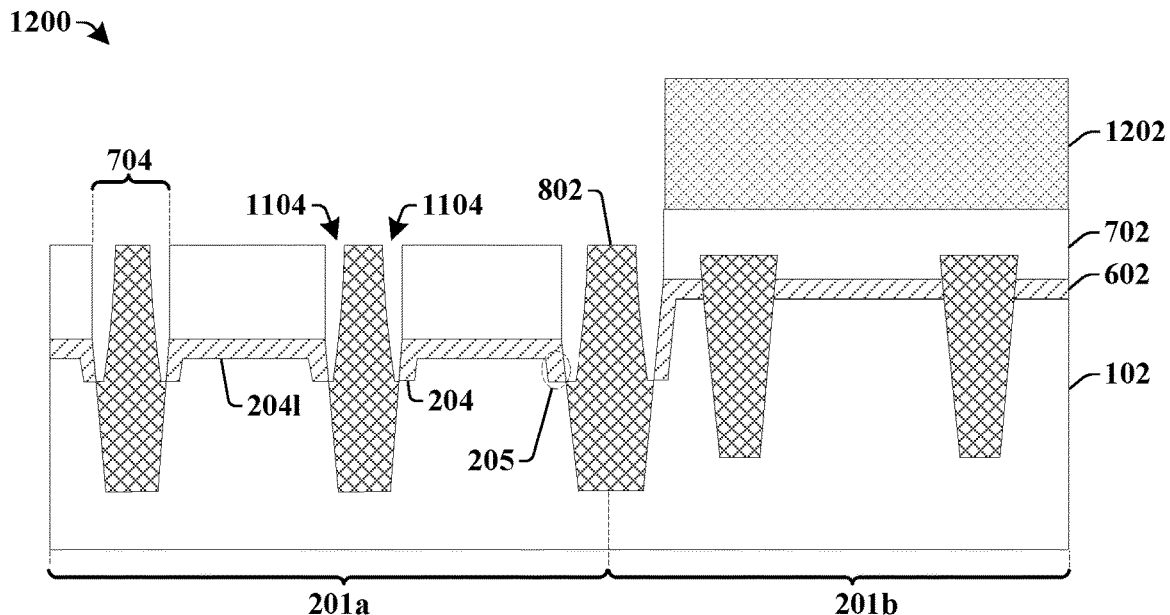

As shown in cross-sectional view 1200 of FIG. 12, an etch back process may be performed to remove the sacrificial masking layer 904. In some embodiments, the etch back process may be performed using a fourth masking layer 1202. In such embodiments, unmasked parts of the second protective layer 702 and the second isolation layer 802 may also be etched back, so that uppermost surfaces of the second protective layer 702 and the second isolation layer 802 within the embedded memory region 201a are below an uppermost surface of the second protective layer 702 within the embedded logic region 201b.

A dielectric is also formed along exposed sidewalls of the substrate 102 defining the second plurality of trenches 704 to form a first dielectric layer 204. The formation of the dielectric causes the first dielectric layer 204 to have protrusions 205 extending outward (e.g., downward) from a lower surface 204l of the first dielectric layer 204. In some embodiments, the dielectric may be formed by way of a thermal oxidation process that forms the dielectric along exposed sidewalls of the substrate 102. In some such embodiments, the first dielectric layer 204 may extend vertically past the depressions 1104 by a first non-zero distance (not shown). In other embodiments, the dielectric may be formed by way of a deposition process.

Figure 13:
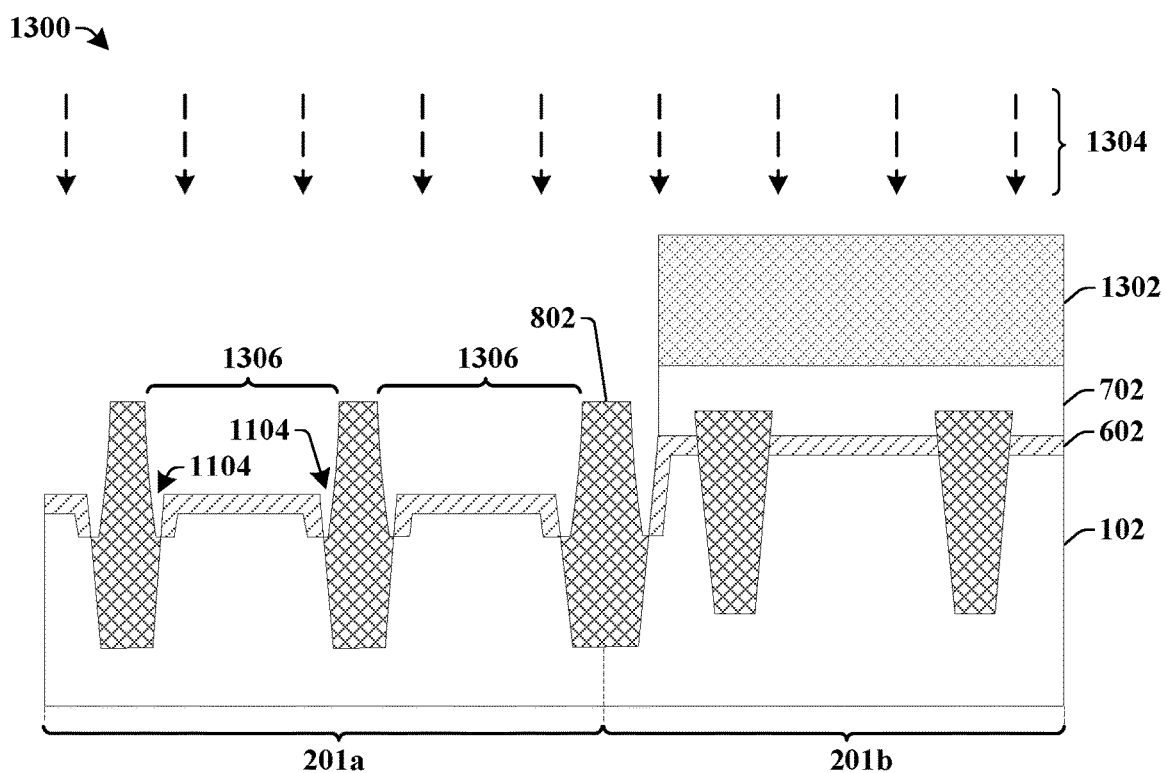

As shown in cross-sectional view 1300 of FIG. 13, the second protective layer 702 is removed from within the embedded memory region 201a. In some embodiments, the second protective layer 702 may be removed by forming a fifth masking layer 1302 over the logic region 201b, followed an etching process that exposes the second protective layer 702 to a fifth etchant 1304 having a high etching selectivity with respect to the first isolation layer 802. In some embodiments, the fifth masking layer 1302 may be a same layer as the fourth masking layer 1202. Removing the second protective layer 702 from within the embedded memory region 201a defines floating gate recesses 1306 between sidewalls of the second isolation layer 802. The depressions 1104 extend outward from the floating gate recesses 1306 to between the second isolation layer 802 and the substrate 102.

Figure 14:
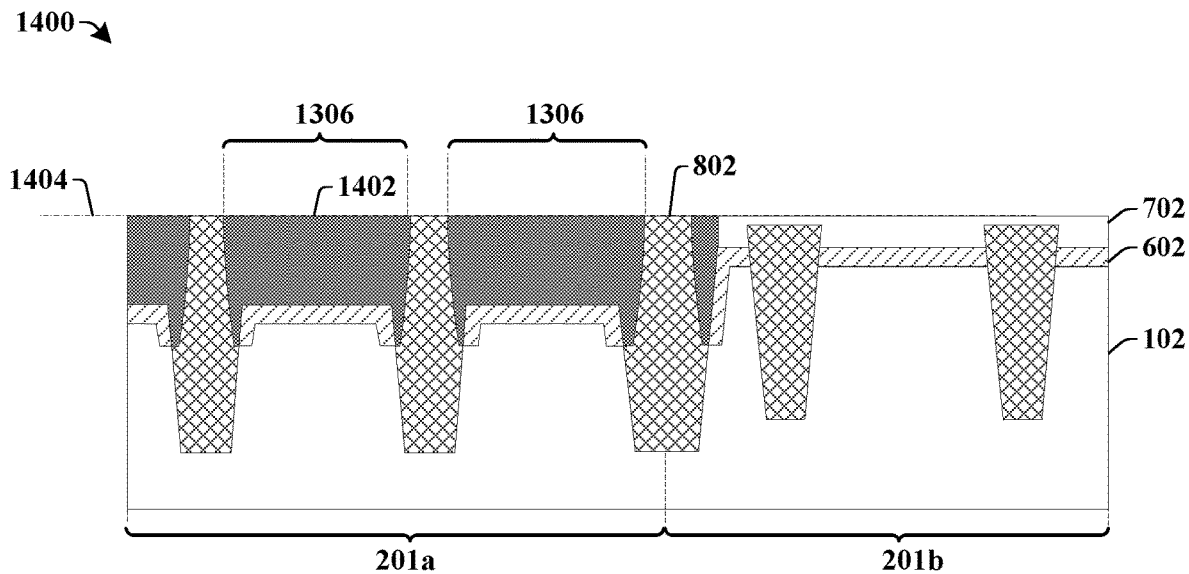

As shown in cross-sectional view 1400 of FIG. 14, a floating gate material 1402 is formed within the floating gate recesses 1306. In some embodiments, the floating gate material 1402 may comprise doped polysilicon. In some embodiments, the floating gate material 1402 may be formed by way of a deposition process. In some embodiments, after formation of the floating gate material 1402 is completed, a third planarization process (e.g., a chemical mechanical planarization process) may be performed along line 1404. The third planarization process forms a substantially planar surface along tops of the floating gate material 1402 and the second isolation layer 802.

Figure 15:
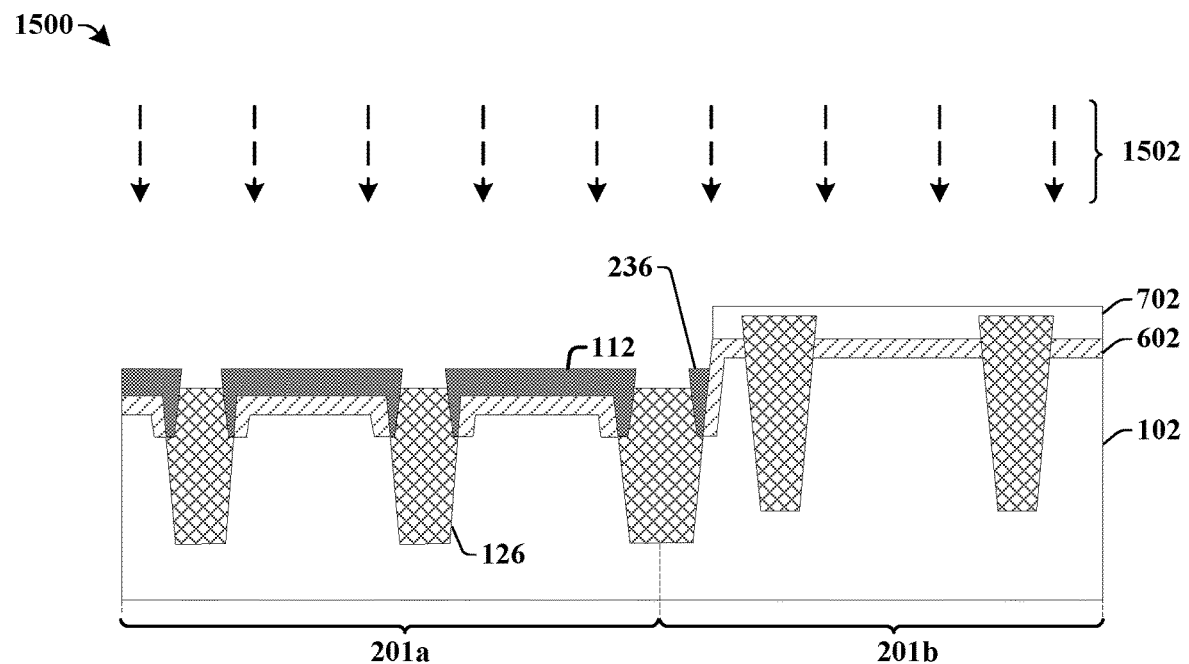

As shown in cross-sectional view 1500 of FIG. 15, the floating gate material (1402 of FIG. 14) is exposed to a sixth etchant 1502, which etches back the floating gate material to define a plurality of floating gates 112. In some embodiments, the etch back process leaves a remnant of the floating gate material 236 along a sidewall of the substrate 102 between the embedded memory region 201a and the logic region 201b. In some embodiments, the second isolation layer (802 of FIG. 14) may also be etched back (e.g., using a different etchant) to define a plurality of isolation structures 126 that have uppermost surfaces that are recessed below top surfaces of the plurality of floating gates 112.

Figure 16A:
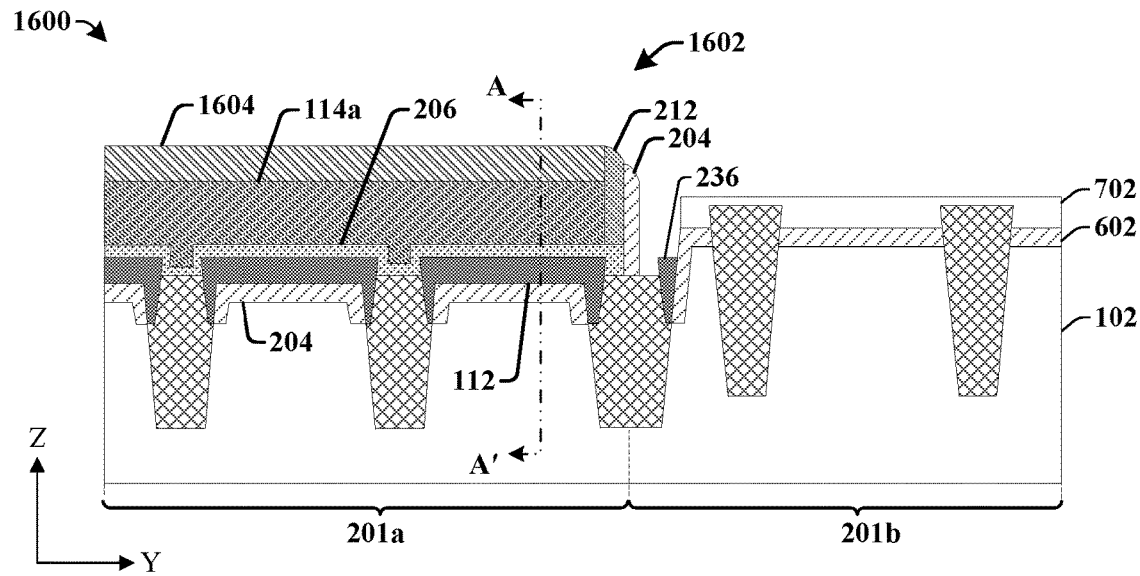
Figure 16B:
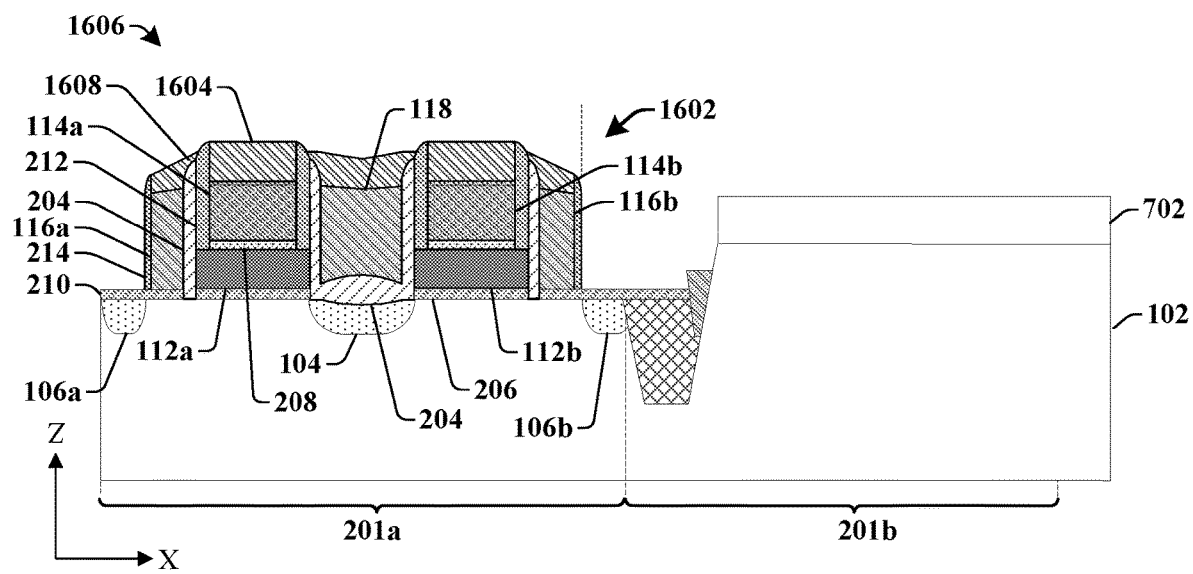

As shown in cross-sectional views 1600 of FIG. 16A and cross-sectional view 1606 of FIG. 16B, a remainder of an embedded flash memory structure 1602 is formed over the substrate 102. Cross-sectional view 1600 is illustrated in a first direction (Y-direction) and in a second direction (Z-direction). Cross-sectional view 1606 is illustrated along cross-section A-A' of FIG. 16A in a third direction (X-direction) and in the second direction (Z-direction).

In some embodiments, the embedded flash memory structure 1602 may be formed by forming a second dielectric layer 206 over the plurality of floating gates 112, a control gate layer over the second dielectric layer 206, and a first patterned hard mask 1604 over the control gate layer. The control gate layer and the second dielectric layer 206 are subsequently etched according to the first patterned hard mask 1604 to define a first control gate 114a and a second control gate 114b over the second dielectric layer 206. A first implantation process may subsequently be performed to form a common source region 104 within the substrate 102.

A first sidewall spacer 212 is formed along sidewalls of the first control gate 114a and the second control gate 114b. The plurality of floating gates 112 are subsequently etched to separate the floating gates along the first direction (x-direction). For example, etching a first one of the plurality of floating gates 112 forms a first floating gate 112a and a second floating gate 112b. A first dielectric layer 204 is formed along sidewalls of the first sidewall spacer 212, the first floating gate 112a, and the second floating gate 112b.

A conductive layer (e.g., doped polysilicon) is subsequently formed over the substrate 102 within the embedded memory region 201a. A second hard mask layer 1608 is formed over the conductive layer, and the conductive layer is selectively etched to define a first select gate 116a along a sidewall of the first floating gate 112a, a second select gate 116b along a sidewall of the second floating gate 112b, and a common erase gate 118 between the first floating gate 112a and the second floating gate 112b. A second sidewall spacer 214 is subsequently formed along a sidewall of the first select gate 116a facing away from the first floating gate 112a and along a sidewall of the second select gate 116b facing away from the second floating gate 112b. A second implantation process may subsequently be performed to form a first drain region 106a and a second drain region 106b within the substrate 102.

Figure 17:
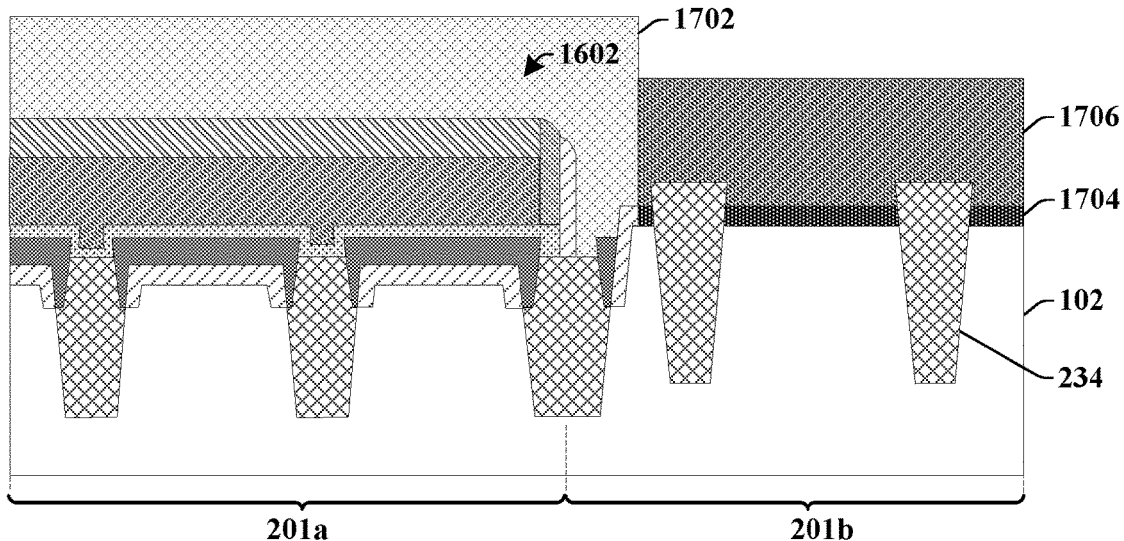

As shown in cross-sectional views 1700 of FIG. 17, a sixth masking layer 1702 is formed over the embedded memory region 201a of the substrate 102. The second protective layer (702 of FIG. 16B) and the pad dielectric layer (602 of FIG. 16B) are subsequently removed from within the logic region 201b. After removing the second protective layer and the pad dielectric layer, a gate dielectric layer 1704 and a sacrificial gate layer 1706 are formed over the logic region 201b of the substrate 102. In some embodiments, the gate dielectric layer 1704 may comprise one or more dielectric materials including a high-k dielectric material and the sacrificial gate layer 1706 may comprise polysilicon.

Figure 18:
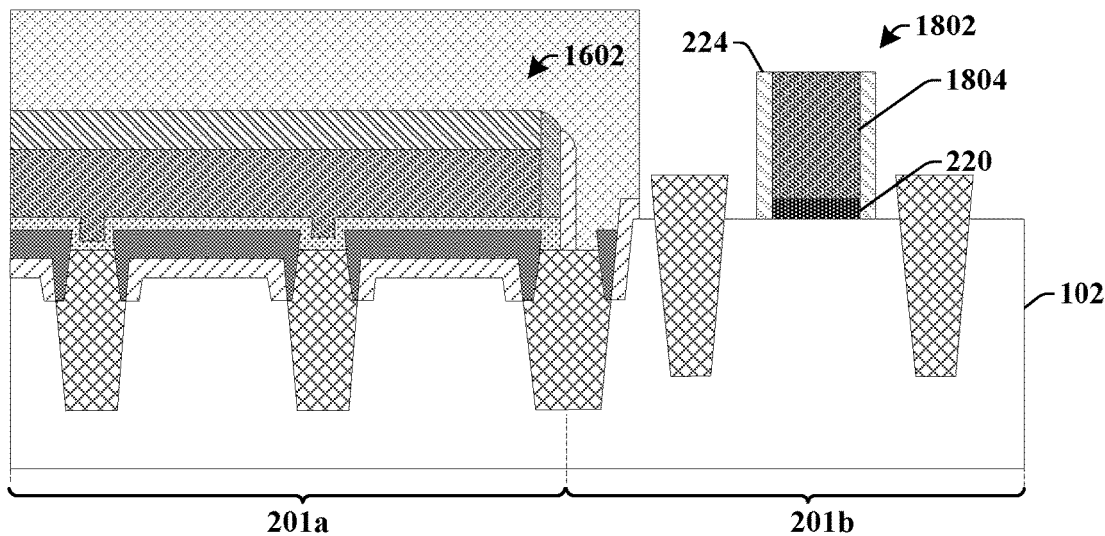

As shown in cross-sectional view 1800 of FIG. 18, the gate dielectric layer (1704 of FIG. 17) and a sacrificial gate layer (1706 of FIG. 17) are patterned to define a dummy gate structure 1802 within the logic region 201b. The dummy gate structure 1802 comprises a dummy gate electrode 1804 over a gate dielectric layer 220 having one or more dielectric materials. In some embodiments, the gate dielectric layer (1704 of FIG. 17) and a sacrificial gate layer (1706 of FIG. 17) may be patterned by selectively exposing the gate dielectric layer (1704 of FIG. 17) and a sacrificial gate layer (1706 of FIG. 17) to a seventh etchant according to a seventh masking layer (not shown) formed over the sacrificial gate layer.

In some embodiments, sidewall spacers 224 may be formed along sidewalls of the dummy gate structure 1802. In some embodiments, the sidewall spacers 224 may be formed by depositing one or more dielectric materials over the substrate 102 and subsequently etching the one or more dielectric materials to remove the dielectric materials from horizontal surfaces. In some embodiments, the one or more dielectric materials may comprise an oxide, a nitride, a carbide, or the like.

Figure 19:
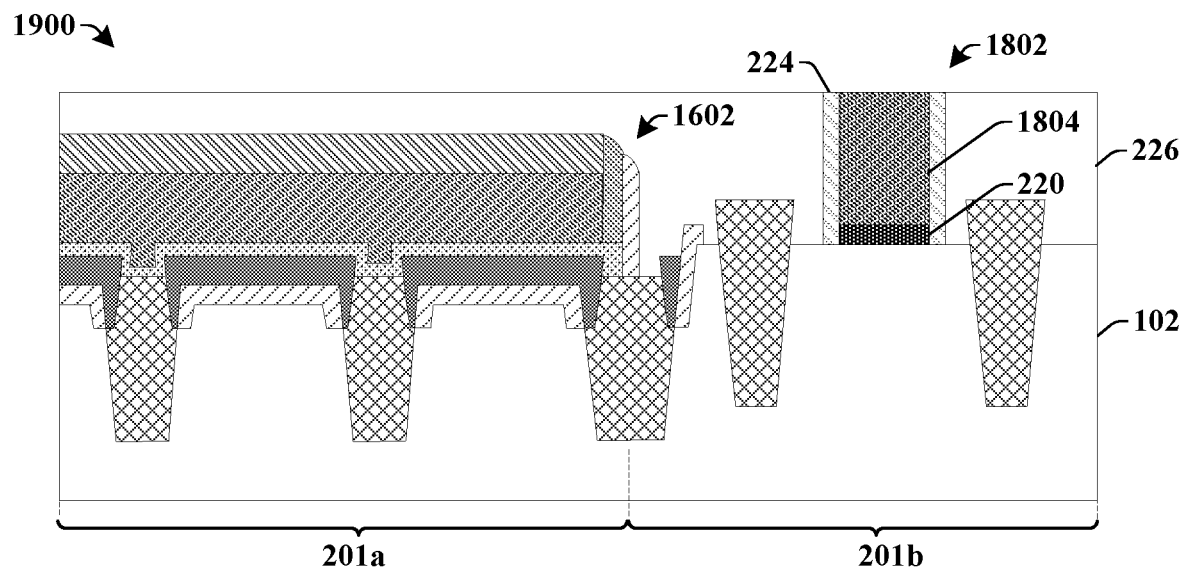

As shown in cross-sectional view 1900 of FIG. 19, a first inter-level dielectric (ILD) layer 226 is formed over the substrate 102. The first ILD layer 226 laterally surrounds the embedded flash memory structure 1602 and the dummy gate structure 1802. In various embodiments, the first ILD layer 226 may comprise an oxide deposited onto the substrate 102 by a chemical vapor deposition (CVD) deposition using high aspect ratio process (i.e., a HARP oxide). For example, in some embodiments, the first ILD layer 226 may comprise boron-phosphor-silicate glass deposited by a CVD process. After formation of the first ILD layer 226, a fourth planarization process may be performed to expose upper surfaces of the dummy gate electrode 1804.

Figure 20:
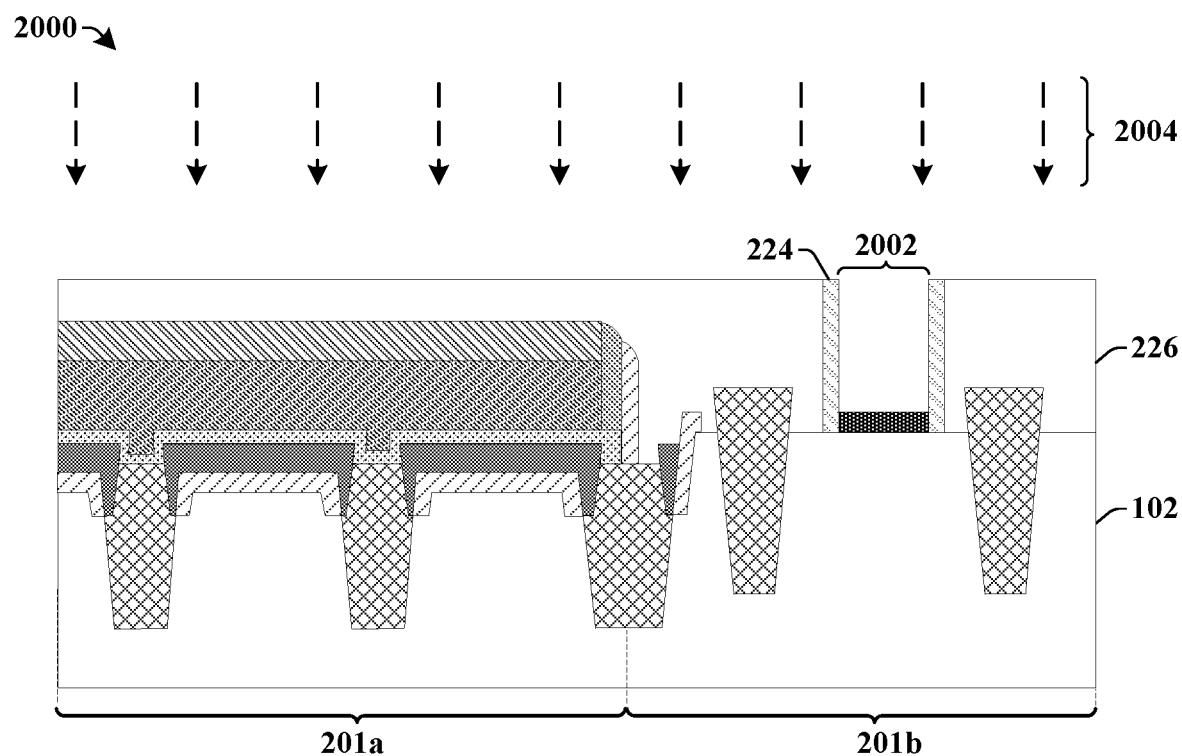

As shown in cross-sectional view 2000 of FIG. 20, the sacrificial gate electrode (1804 of FIG. 19) is removed from the dummy gate structure (1802 of FIG. 19) to define a gate electrode cavity 2002. In some embodiments, the sacrificial gate electrode (1804 of FIG. 19) may be removed by selectively exposing the sacrificial gate electrode (1804 of FIG. 19) to a eighth etchant 2004.

Figure 21:
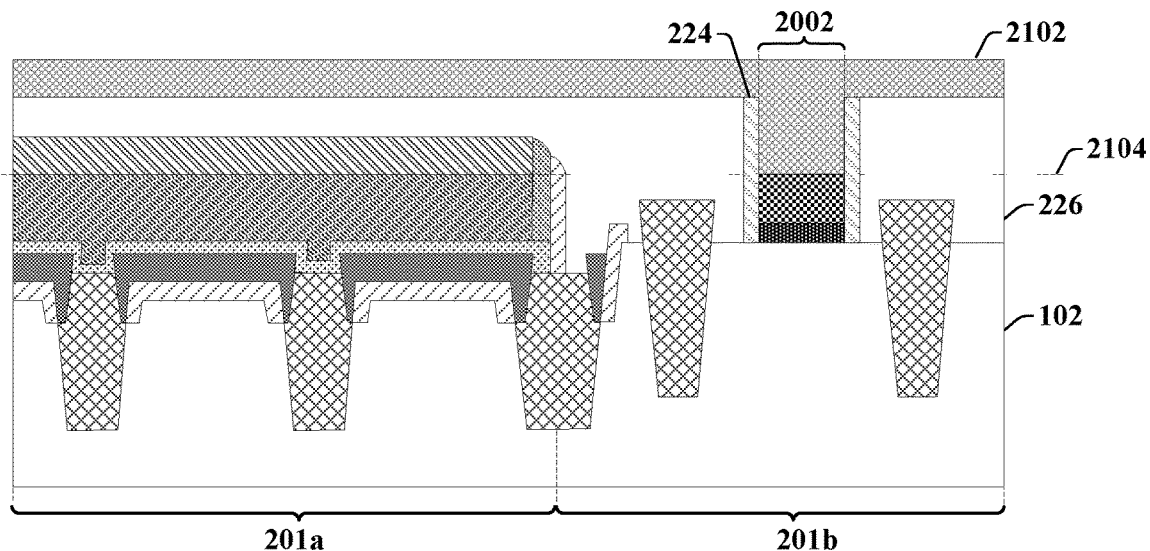

As shown in cross-sectional view 2100 of FIG. 21, a metal gate material 2102 is formed over the gate dielectric layer 220. The metal gate material 2102 fills the gate electrode cavity 2002. In some embodiments, the metal gate material 2102 may be formed using a deposition technique (e.g., PVD, CVD, ALD, PE-CVD, etc.). A fifth planarization process is subsequently performed along line 2104. The fifth planarization process removes a part of the metal gate material 2102 from over the first ILD layer 226 to define a gate electrode 218. The fifth planarization process may also remove the hard mask layer to define an embedded flash memory structure 107. In some embodiments, the metal gate material 2102 may comprise an n-type gate metal such as aluminum, tantalum, titanium, hafnium, zirconium, titanium silicide, tantalum nitride, tantalum silicon nitride, chromium, tungsten, cooper, titanium aluminum, or the like. In other embodiments, the metal gate material 2102 may comprise a p-type gate metal such as nickel, cobalt, molybdenum, platinum, lead, gold, tantalum nitride, molybdenum silicide, ruthenium, chromium, tungsten, copper, or the like.

Figure 22:
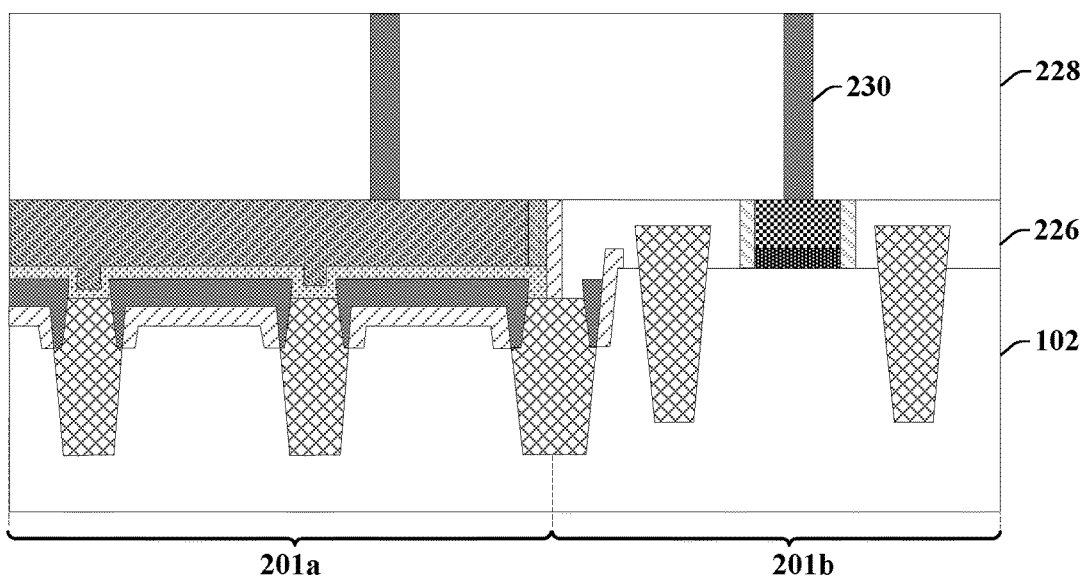

As shown in cross-sectional view 2200 of FIG. 22, conductive contacts 230 are formed within a second inter-level dielectric (ILD) layer 228 overlying the first ILD layer 226. The conductive contacts 230 may be formed by forming the second ILD layer over the first ILD layer 226, selectively etching the second ILD layer 228 to form openings, and subsequently depositing a conductive material within the openings. In some embodiments, the conductive material may comprise tungsten (W) or titanium nitride (TiN), for example.

Figure 23:
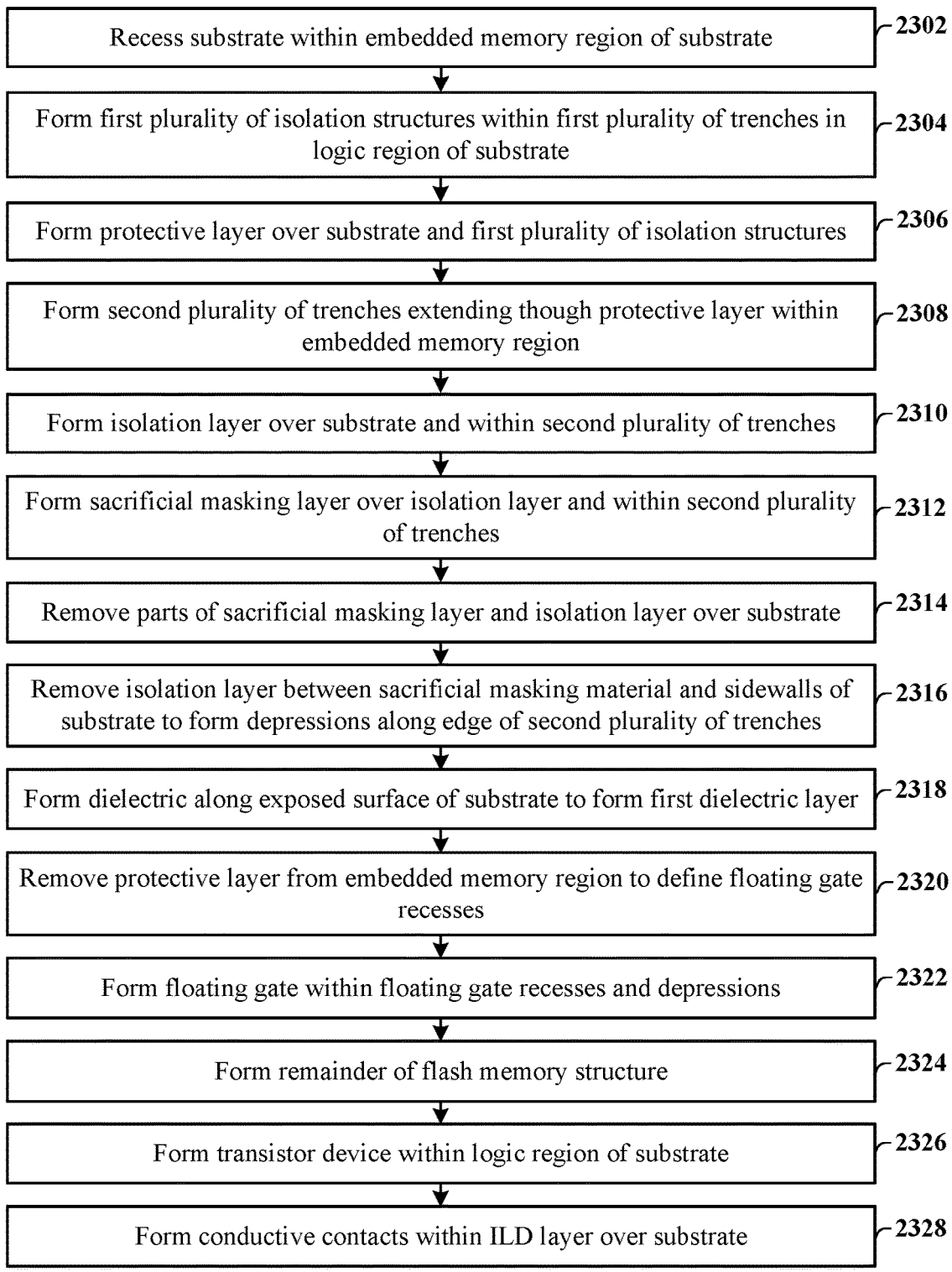
FIG. 23 illustrates a flow diagram of some embodiments of a method of forming an integrated chip having an embedded flash memory structure with an enhanced floating gate.

FIG. 23 illustrates a flow diagram of some embodiments of a method 2300 of forming an integrated chip having an embedded flash memory device with an enhanced floating gate.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2302, a substrate is recessed within an embedded memory region of the substrate. FIG. 4 illustrates a cross-sectional view 400 of some embodiments corresponding to act 2302.

At act 2304, a plurality of isolation structures are formed within a first plurality of trenches within a logic region of the substrate. FIGS. 5-6 illustrate cross-sectional views 500-600 of some embodiments corresponding to act 2304.

At act 2306, a protective layer is formed over the substrate and the first plurality of isolation structures. FIG. 7 illustrates a cross-sectional view 700 of some embodiments corresponding to act 2306.

At act 2308, a second plurality of trenches are formed within the embedded memory region. FIG. 7 illustrates a cross-sectional view 700 of some embodiments corresponding to act 2308.

At act 2310, an isolation layer is formed over the substrate and within the second plurality of trenches. FIG. 8 illustrates a cross-sectional view 800 of some embodiments corresponding to act 2310.

At act 2312, a sacrificial masking layer is formed over the isolation layer and within the second plurality of trenches. FIG. 9 illustrates a cross-sectional view 900 of some embodiments corresponding to act 2312.

At act 2314, parts of the sacrificial masking layer and the isolation layer over the substrate are removed. A remainder of the sacrificial masking layer has outermost sidewalls that are separated from sidewalls of the substrate defining the second plurality of trenches by the isolation layer. FIG. 10 illustrates a cross-sectional view 1000 of some embodiments corresponding to act 2314.

At act 2316, the isolation layer between the sacrificial masking layer and the sidewalls of the substrate is removed to form depressions along edges of the second plurality of trenches. FIG. 11 illustrates a cross-sectional view 1100 of some embodiments corresponding to act 2316.

At act 2318, a dielectric is formed on exposed surfaces of the substrate. In some embodiments, the dielectric may be formed by performing a thermal oxidation process on exposed surfaces of the substrate. FIG. 12 illustrates a cross-sectional view 1200 of some embodiments corresponding to act 2318.

At act 2320, the protective layer is removed from within the embedded memory region to define floating gate recesses. FIG. 13 illustrates a cross-sectional view 1300 of some embodiments corresponding to act 2320.

At act 2322, a floating gate is formed within the floating gate recesses and the depressions. FIGS. 14-15 illustrate cross-sectional views 1400-1500 of some embodiments corresponding to act 2322.

At act 2324, a remainder of a flash memory structure is formed. FIGS. 16A-16B illustrate cross-sectional views, 1600 and 1606, of some embodiments corresponding to act 2324.

At act 2326, a transistor device is formed within the logic region. In some embodiments, the transistor device may be formed using a high-k metal gate (HKMG) replacement process. FIGS. 17-21 illustrate cross-sectional views 1700-2100 of some embodiments corresponding to act 2326.

At act 2328, conductive contacts are formed within an ILD layer over the substrate. FIG. 22 illustrates a cross-sectional view 2200 of some embodiments corresponding to act 2328.

Accordingly, in some embodiments, the present disclosure relates to an integrated chip having a flash memory structure with a floating gate that has sidewalls defining protrusions extending outward (e.g., downward) from a lower surface of the floating gate. The protrusions cause the floating gate to wrap around a part of the substrate where a channel region forms, thereby improving performance of the flash memory structure by increasing a size of an interfacing area between the channel region and the floating gate.

In some embodiments, the present disclosure relates to a flash memory structure. The flash memory structure includes a source region and a drain region disposed within a substrate; a select gate disposed over the substrate between the source region and the drain region; a floating gate disposed over the substrate between the select gate and the source region; and a control gate disposed over the floating gate; the floating gate has sidewalls that define protrusions extending downward from a lower surface of the floating gate to define a recess within a bottom of the floating gate. In some embodiments, the flash memory structure further includes a plurality of isolation structures disposed within trenches defined by sidewalls of the substrate, the source region and the drain region are separated along a first direction and floating gate is disposed between the isolation structures along a second direction perpendicular to the first direction. In some embodiments, the plurality of isolation structures have an uppermost surface that is above a bottom surface of the floating gate and below a top surface of the floating gate. In some embodiments, the flash memory structure further includes a dielectric layer arranged between the floating gate and the substrate, the dielectric layer is arranged along the sidewalls of the substrate. In some embodiments, the dielectric layer vertically extends to below a bottommost surface of the floating gate. In some embodiments, the protrusions are arranged between the dielectric layer and the isolation structures. In some embodiments, the source region and the drain region are separated by a part of the substrate comprising a channel region; and the floating gate wraps around a multiple surfaces of the part of the substrate comprising the channel region. In some embodiments, the protrusions have angled sidewalls that reduce a width of the protrusions as a distance from the lower surface of the floating gate increases. In some embodiments, the floating gate has a greater height along outer sidewalls of the floating gate than at a center of the floating gate. In some embodiments, the flash memory structure further includes a transistor device arranged over an upper surface of the substrate, the floating gate is arranged over a recessed surface of the substrate that is coupled to the upper surface of the substrate by a sidewall of the substrate; a remnant of floating gate material is arranged along the sidewall.

In other embodiments, the present disclosure relates to a flash memory structure. The flash memory structure includes a source region and a drain region disposed within a substrate and separated along a first direction by a channel region; a plurality of isolation structures disposed within trenches defined by sidewalls of the substrate, the plurality of isolation structures separated along second direction perpendicular to the first direction; a control gate disposed over the channel region; and a floating gate arranged vertically between the control gate and the channel region and laterally between the isolation structures, the floating gate extends into the trenches defined by the sidewalls of the substrate. In some embodiments, the floating gate has sidewalls that define protrusions extending outward from a lower surface of the floating gate. In some embodiments, the protrusions have opposing sidewalls that are oriented at different sidewall angles with respect to a horizontal plane. In some embodiments, the flash memory structure further includes a first dielectric layer arranged between the floating gate and the substrate, the first dielectric layer arranged along the sidewalls of the substrate. In some embodiments, the first dielectric layer vertically extends to below a bottommost surface of the floating gate. In some embodiments, the floating gate is arranged directly between the first dielectric layer and the isolation structures.

In yet other embodiments, the present disclosure relates to a method of forming a flash memory structure. The method includes forming a protective layer over a substrate; forming a plurality of trenches extending through the protective layer to within the substrate; forming an isolation layer over the protective layer and within the plurality of trenches; forming a sacrificial masking layer over the isolation layer; removing parts of the sacrificial masking layer and the isolation layer, a remainder of the sacrificial masking layer having outermost sidewalls that are separated from sidewalls of the protective layer defining the plurality of trenches by the isolation layer; selectively etching the isolation layer between the sacrificial masking layer and the sidewalls of the protective layer to form depressions along edges of the plurality of trenches; removing the protective layer to define floating gate recesses; and forming a floating gate material within the floating gate recesses and the depressions. In some embodiments, the method further includes performing a thermal oxidation process after removing the protective layer, wherein the thermal oxidation process forms an oxide along sidewalls of the substrate defining the depressions. In some embodiments, the method further includes etching the floating gate material to reduce a thickness of the floating gate material and define a plurality of floating gates. In some embodiments, the depressions extend though the protective layer to within the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory structure, comprising:
    a source region and a drain region disposed within a substrate;
    a select gate disposed over the substrate between the source region and the drain region;
    a floating gate disposed over the substrate between the select gate and the source region;
    a control gate disposed over the floating gate; and
    wherein the floating gate has sidewalls that define protrusions extending downward from a lower surface of the floating gate to define a recess within a bottom of the floating gate.

2. The flash memory structure of claim 1, further comprising:
    a plurality of isolation structures disposed within trenches defined by sidewalls of the substrate, wherein the source region and the drain region are separated along a first direction and the floating gate is disposed between the plurality of isolation structures along a second direction perpendicular to the first direction.

3. The flash memory structure of claim 2, wherein the plurality of isolation structures have an uppermost surface that is above a bottom surface of the floating gate and below a top surface of the floating gate.

4. The flash memory structure of claim 2, further comprising:
    a dielectric layer arranged between the floating gate and the substrate, wherein the dielectric layer is arranged along the sidewalls of the substrate.

5. The flash memory structure of claim 4, wherein the dielectric layer vertically extends to below a bottommost surface of the floating gate.

6. The flash memory structure of claim 4, wherein the protrusions are arranged between the dielectric layer and the plurality of isolation structures.

7. The flash memory structure of claim 1,
    wherein the source region and the drain region are separated by a part of the substrate comprising a channel region; and
    wherein the floating gate wraps around a multiple surfaces of the part of the substrate comprising the channel region.

8. The flash memory structure of claim 1, wherein the protrusions have angled sidewalls that reduce a width of the protrusions as a distance from the lower surface of the floating gate increases.

9. The flash memory structure of claim 1, wherein the floating gate has a greater height along outer sidewalls of the floating gate than at a center of the floating gate.

10. The flash memory structure of claim 1, further comprising:
    a transistor device arranged over an upper surface of the substrate, wherein the floating gate is arranged over a recessed surface of the substrate that is coupled to the upper surface of the substrate by a sidewall of the substrate; and
    wherein a remnant of floating gate material is arranged along the sidewall of the substrate.

11. A flash memory structure, comprising:
    a source region and a drain region disposed within a substrate and separated along a first direction by a channel region;
    a plurality of isolation structures disposed within trenches defined by sidewalls of the substrate, wherein the plurality of isolation structures are separated along a second direction perpendicular to the first direction;
    a control gate disposed over the channel region;
    a floating gate arranged vertically between the control gate and the channel region and laterally between the plurality of isolation structures, wherein the floating gate extends into the trenches defined by the sidewalls of the substrate; and
    a first dielectric layer arranged between the floating gate and the substrate, wherein the first dielectric layer is arranged along the sidewalls of the substrate.

12. The flash memory structure of claim 11, wherein the floating gate has sidewalls that define protrusions extending vertically outward from a lower surface of the floating gate.

13. The flash memory structure of claim 12, wherein the protrusions have opposing sidewalls that are oriented at different sidewall angles with respect to a horizontal plane.

14. The flash memory structure of claim 11, wherein the first dielectric layer vertically extends to below a bottommost surface of the floating gate.

15. The flash memory structure of claim 11, wherein the floating gate is arranged directly between the first dielectric layer and the plurality of isolation structures.

16. A method of forming a flash memory structure, comprising:
    forming a protective layer over a substrate;
    forming a plurality of trenches extending through the protective layer to within the substrate;
    forming an isolation layer over the protective layer and within the plurality of trenches;
    forming a sacrificial masking layer over the isolation layer;
    removing parts of the sacrificial masking layer and the isolation layer, wherein a remainder of the sacrificial masking layer has outermost sidewalls that are separated from sidewalls of the protective layer defining the plurality of trenches by the isolation layer;
    selectively etching the isolation layer between the sacrificial masking layer and the sidewalls of the protective layer to form depressions along edges of the plurality of trenches;
    removing the protective layer to define floating gate recesses; and
    forming a floating gate material within the floating gate recesses and the depressions.

17. The method of claim 16, further comprising:
    performing a thermal oxidation process after removing the protective layer, wherein the thermal oxidation process forms an oxide along sidewalls of the substrate defining the depressions.

18. The method of claim 16, further comprising:
    etching the floating gate material to reduce a thickness of the floating gate material and define a plurality of floating gates.

19. The method of claim 16, wherein the depressions extend though the protective layer to within the substrate.

20. The flash memory structure of claim 1, further comprising:
    an isolation structure comprising a dielectric material disposed within a trench defined by a sidewall of the substrate, wherein the floating gate is arranged directly between the sidewall of the substrate and a sidewall of the isolation structure.

* * * * *